United States Patent
Kamoshida et al.

(10) Patent No.: US 6,292,411 B1
(45) Date of Patent: Sep. 18, 2001

(54) DELAY CONTROL CIRCUIT SYNCHRONOUS WITH CLOCK SIGNAL

(75) Inventors: Masahiro Kamoshida; Hironobu Akita, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/537,424

(22) Filed: Mar. 27, 2000

(30) Foreign Application Priority Data

Mar. 30, 1999 (JP) .................................................. 11-087745

(51) Int. Cl.[7] ....................................................... G11C 7/00

(52) U.S. Cl. ........................................... 365/194; 365/233

(58) Field of Search ..................... 365/194, 233

(56) References Cited

U.S. PATENT DOCUMENTS

| 5,774,403 | * | 6/1998 | Clark, II et al. ..................... 365/194 |
| 5,867,432 | | 2/1999 | Toda . | |
| 6,084,453 | | 7/2000 | Fuse et al. . | |
| 6,198,690 | * | 3/2001 | Kato et al. ........................... 365/233 |

FOREIGN PATENT DOCUMENTS

| 8-237091 | 9/1996 | (JP) . |
| 10-69326 | 3/1998 | (JP) . |
| 11-31952 | 2/1999 | (JP) . |
| 11-266239 | 9/1999 | (JP) . |
| 11-272356 | 10/1999 | (JP) . |

OTHER PUBLICATIONS

U.S. application No. 09/166,635, Toda, filed Oct. 5, 1998.
U.S. application No. 09/243,483, Kamoshida, filed Feb. 3, 1999.
U.S. application No. 09/272,171, Kamoshida, filed Mar. 18, 1999.
U.S. application No. 09/271,329, Kamoshida, filed Mar. 18, 1999.
U.S. application No. 09/466,773, Akita, filed Dec. 20, 1999.
U.S. application No. 09/505,204, Isobe, filed Feb. 16, 2000.
U.S. application No. 09/511,352, Akita, filed Feb. 23, 2000.
"A Sub–0.1 $\mu$m Circuit Design with Substrate–Over–Biasing"; Y. Oowaki, et al., 1998 IEEE International Solid–State Circuits Conference.
"A 250Mb/s/pin 1Gb Double Data Rate SDRAM with a Bi–Directional Delay and an Inter–Bank Shared Redundancy Scheme"; Y. Takai, et al., 1999 IEEE International Solid–State Circuits Conference.
"A Direct–Skew–Detect Synchronous Mirror Delay for Application–Specific Integrated Circuits"; T. Saeki, et al., IEEE International Solid–State Circuits, vol. 34 No. 3, Mar. 1999.

(List continued on next page.)

Primary Examiner—Huan Hoang
(74) Attorney, Agent, or Firm—Banner & Witcoff, Ltd.

(57) ABSTRACT

A delay line for forward pulse has a plurality of delay units for forward pulse. A delay line for backward pulse has a plurality of delay units for backward pulse. In the delay line for backward pulse, a pulse signal is propagated in an opposite direction to a direction of the propagation in the delay line for forward pulse. A direction from an input terminal to an output terminal in the delay units for forward pulse is set to be parallel to a direction of the delay line for forward pulse. A direction from an input terminal to an output terminal in the delay units for backward pulse is set to be parallel to a direction of the delay line for backward pulse. The directions from the input terminal to the output terminal in two adjacent ones of the delay units for forward pulse are set to be opposite to one another. The directions from the input terminal to the output terminal in two adjacent ones of the delay units for backward pulse are set to be opposite to one another.

46 Claims, 30 Drawing Sheets

OTHER PUBLICATIONS

"A 2.5–ns Clock Access, 250MHz, 256Mb SDRAM with Synchronous Mirror Delay"; T. Saeki, et al., IEEE International Solid–State Circuits, vol. 31 No. 11, Nov. 1996.

"A 2.5–ns Clock Access, 250MHz, 256Mb SDRAM with Synchronous Mirror Delay"; T. Saeki, et al., 1999 IEEE International Solid–State Circuits Conference.

"A 10ps Jitter 2 Clock Cycle Time CMOS Digital Clock Generator Based on an Interleaved Synchronous Mirror Delay Scheme"; T. Saeki, et al., 1997 Symposium on VLS1 Circuits Digest.

"Digital Delay Locked Loop and Design Technique for High–Speed Synchronous Interface"; Y. Okajima, et al., IEICE Trans. Electron, vol. E79–C, No. 6, Jun. 1996.

* cited by examiner

DIRECTION OF MASK DISPLACEMENT

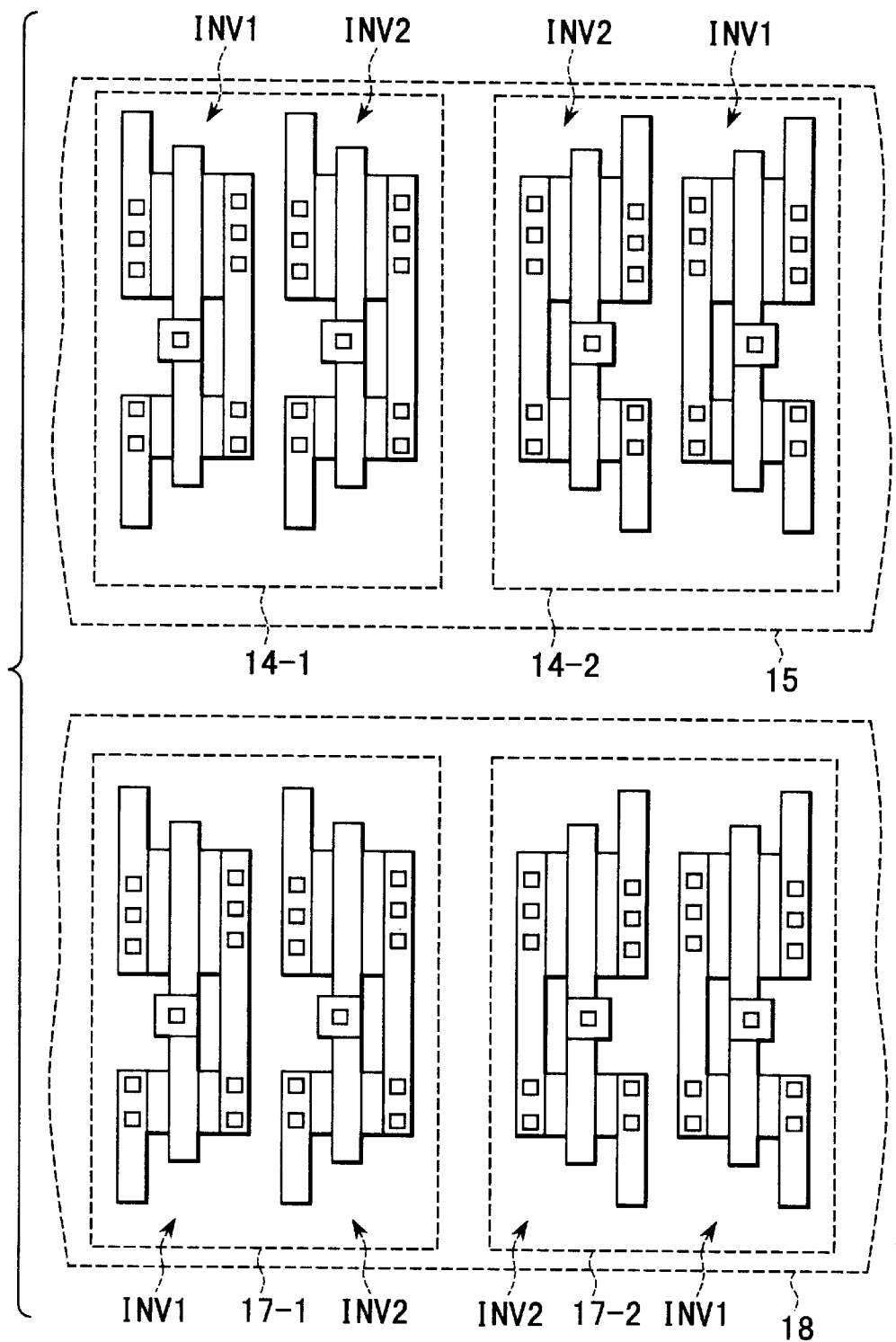
F I G. 22

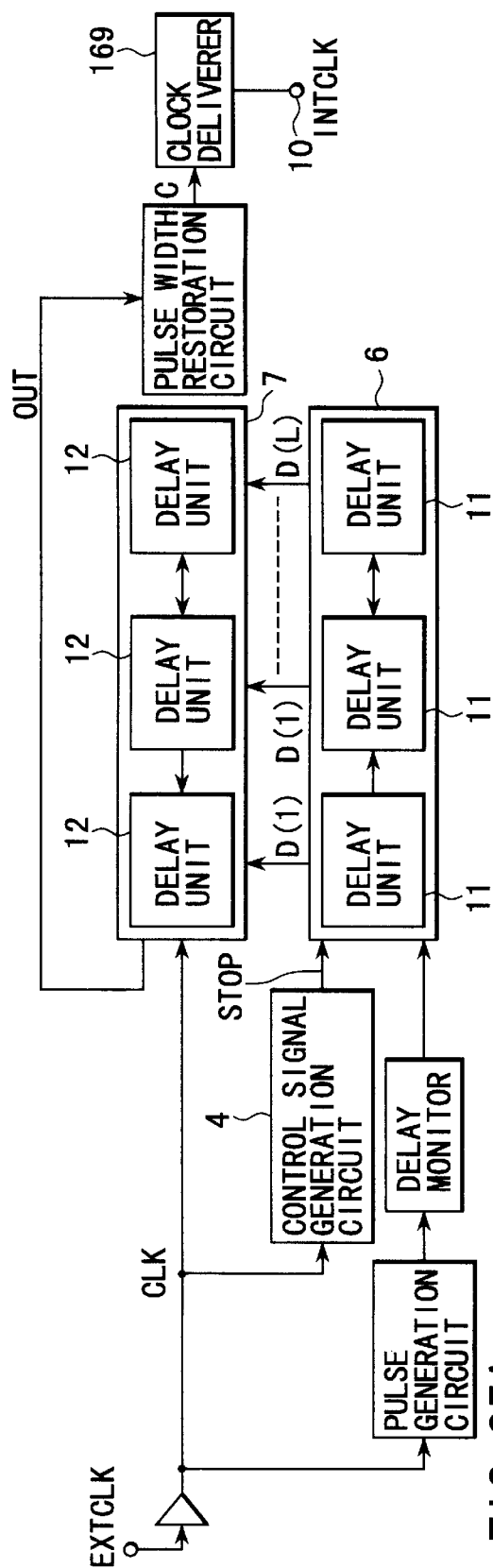
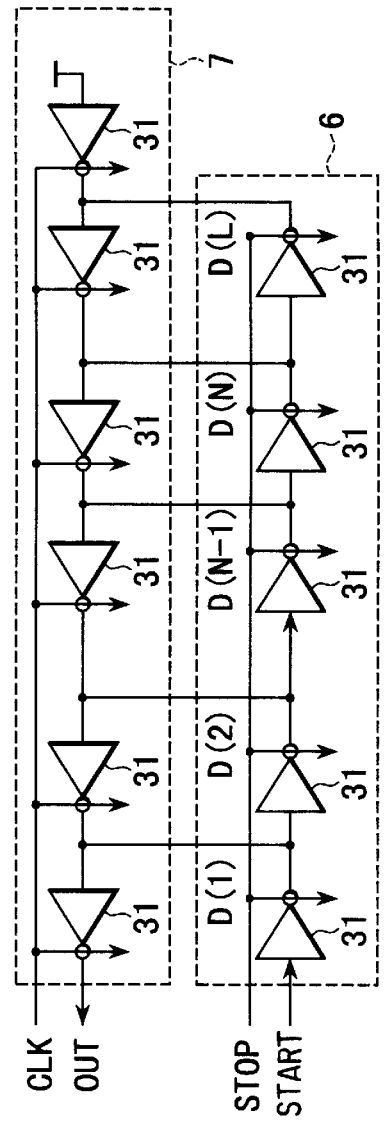
FIG. 35A
FIG. 35B

DELAY CONTROL CIRCUIT SYNCHRONOUS WITH CLOCK SIGNAL

CROSS-REFERENCE TO RELATED APPLICATIONS

This application is based upon and claims the benefit of priority from the prior Japanese Patent Application No. 11-087745, filed Mar. 30, 1999, the entire contents of which are incorporated herein by reference.

BACKGROUND OF THE INVENTION

The present invention relates to a clock synchronization delay control circuit for generating a clock signal (hereinafter called an internal clock signal) that is to be used in a semiconductor integrated circuit and is synchronized with, for example, a clock signal (hereinafter called an external clock signal) supplied from outside into the semiconductor integrated circuit.

Recently, acceleration of the processing in a computer system has been required, and therefore, a clock synchronization memory operated in synchronization of a clock signal of a synchronous DRAM and the like is employed. Such a clock synchronization memory uses the internal clock signal synchronous with the external clock signal that is supplied from the outside to control the memory. When a delay is generated between the internal clock signal and the external clock signal, a malfunction of the circuit occurs. Particularly, in a case where the operating rate is high, the malfunction easily occurs even if a slight delay is generated. For this reason, a clock synchronization delay control circuit is integrated to VLSI to synchronize the internal clock with the external clock.

First, the principle in the operations of the clock synchronization delay control circuit will be briefly explained. FIG. 27 is a block diagram showing a conventional clock synchronization delay control circuit. This circuit is an STBD (Synchronous Traced Backward Delay) disclosed in Jpn. Pat. Appln. KOKAI Publication No. 10-69326. FIG. 28 is a waveform chart explaining the principle in the operations of the clock synchronization delay control circuit. In the following explanations, a case where the output of a delay unit for forward pulse at the N-th stage is connected to the input of a status holding circuit at the N-th stage and the output of the status holding circuit at the N-th stage is connected to the input of a delay unit for backward pulse at the N-1-th stage, will be exemplified so that the operations of the STBD can easily be understood.

It is assumed that an external clock ExtCLK of a cycle τ shown in FIG. 28 is supplied to a receiver 11 of FIG. 27. The external clock ExtCLK is waveform-shaped by the receiver 11 and then amplified. A signal CLK outputted from the receiver 11 is delayed Trc from the external clock ExtCLK (by the receiver 11). The signal CLK is supplied to a control pulse generation circuit 13, a delay monitor (DM) 12 and a delay line 18 for backward pulse. The control pulse generation circuit 13 converts the signal CLK into a pulse and generates a control pulse signal P. The delay monitor 12 has a delay time Trc+Tdr that is equal to the sum of the delay time Trc of the receiver 11 and the delay time Tdr of a driver 19. Output signal FCL of the delay monitor 12 is supplied to the delay line 15 for forward pulse after a delay of Trc+ Tdr from the output signal CLK of the receiver 11.

The delay line 15 for forward pulse is constituted by cascade connection to a delay unit (DU) 14 for forward pulse. When the control pulse signal P is at a low level, each delay unit 14 propagates a forward pulse from the delay unit of the front stage, to the delay unit of the back stage. Further, when the control pulse signal P is at a high level, the each delay unit 14 outputs the low-level signal to stop the propagation of the forward pulse signal and initialize the delay line. The signal FCL is propagated in the delay line 15 for forward pulse during a period τ−(Trc+Tdr) from the start of the propagation to a time when the control pulse signal P becomes at a high level.

A status holding circuit 16 stores the propagated state of the forward pulse signal. In accordance with the stored information, the status holding circuit 16 controls the delay line 18 for backward pulse so that the propagation time of the backward pulse signal propagated in the delay line 18 for backward pulse is equal to the propagation time of the forward pulse signal. The status holding circuit 16 has two kinds of the states, i.e. a set state and a reset state, and outputs the control signal responding to the state to a delay unit (DU) 17 for backward pulse. In FIG. 27, "S" represents the set state and "R" represents the reset state. The delay unit 17 controlled by the status holding circuit 16 in the set state "S" outputs a logic value equal to the output of the delay unit 17 of the back stage to the delay unit of the front stage. The delay unit 17 controlled by the status holding circuit 16 in the reset state "R" outputs the output signal of the receiver 11 to the delay unit of the front stage. All the status holding section 16 are initially in the reset state. The status holding circuit 16 remains in the reset state "R" if the forward pulse signal is not propagated to the connected delay unit 14 when the control pulse signal P is at a low level. On the other hand, the status holding section 16 becomes in the set state "S" if the forward pulse signal is propagated thereto when the control pulse signal P is at a low level. Further, the status holding section 16 becomes in the reset state "R" if the backward pulse signal is propagated to the delay unit 17 when the control pulse signal P is at a high level.

When the control pulse signal P becomes at a high level, the signal CLX is at a high level. Therefore, the high-level signal is supplied to the delay unit 17 controlled by the status holding section 16 of the N+1-th and the following stages in the reset state "R". If the number of stages at which the forward pulse signal is propagated is N, the status holding sections 16 at the first to N-th stages are in the set state "S". Therefore, the signal which is output from the delay unit 17 of the N-th stage controlled by the status holding section of the N+1-th stage in the reset state "R", is propagated as the backward pulse signal by the delay unit 17 at N-1th stage to first stage. Therefore, the number of stages of the delay units to which the backward pulse signal is propagated becomes equal to the number of stages of the delay units to which the forward pulse signal is propagated. When the delay units are designed so that the delay time thereof is equally Δdu, the signal CLX which is input to the delay line 18 for backward pulse is propagated in the delay line and then output, during the same period τ−(Trc+Tdr) as the period in which the forward pulse signal is propagated. The output signal RCL of the delay line 18 for backward pulse is supplied to the driver 19. Output signal IntCLK of the driver 19 is delayed by the delay time Tdr thereof. If the delay time from the supply of the external clock signal ExtCLK to the generation of the internal clock signal IntCLK is Δtotal, Δtotal can be obtained in Equation (1).

$$\Delta total = Trc + (Trc + Tdr) + 2\{\tau - (Trc + Tdr)\} + Tdr = 2\tau \quad (1)$$

As evident from Equation (1), the delay time of the internal clock signal to the external clock signal is 2 τ, and consequently, the external clock signal and the internal clock signal are synthesized with one another.

In the delay line constituting the clock synchronization delay control circuit such as the above-described STBD, the direction of the pulse signal propagated to the delay line 15 for forward pulse is opposite to that of the pulse signal propagated in the delay line 18 for backward pulse.

FIG. 29 schematically shows the structure of the delay units constituting the delay line 15 for forward pulse and the delay line 18 for backward pulse. As shown in the figure, a position of an input terminal IN is designed to be opposite to the position of an output terminal OUT in each of the delay units 14 and delay unit 17.

Direction from IN to OUT of each delay units 14 constituting delay line 15 is same to direction of forward pulse propagating the delay line 15. Similarly, direction from IN to OUT of each delay units 14 constituting delay line 18 is same to direction of backward pulse propagating the delay line 18. Direction of each delay unit is opposite to that of delay unit 17.

FIG. 30 specifically shows the delay units 14 and 17 shown in FIG. 29, illustrating a layout of constituting each of the delay units 14 and 17 with two inverter circuits. FIG. 31 shows a case where a mask is displaced in a direction of an arrow (a direction of a channel length of a MOS transistor (i.e. a direction from a source area to a drain area)) at the time of producing the delay units 14 and 17 shown in FIG. 29. The mask displacement means that an exposure pattern shifts. Thus, when the mask is displaced, the characteristics of the delay units 14 for forward pulse and the delay units 17 for backward pulse will become different. For this reason, the delay time of the delay unit 14 for forward pulse is not equal to that of the delay unit 17 for backward pulse.

When the delay time of the delay unit 14 for forward pulse is represented by tdu-1 and the delay time of the delay unit 17 for backward pulse is represented by tdu-s, the relationship of the delay time in the circuit shown in FIG. 29 can be represented as shown in FIG. 32. For this reason, the forward pulse is propagated to the N-th stage of the delay unit for forward pulse during $\tau-(Trc+Tdr)$, and when the backward pulse is propagated from the N-th stage of the delay unit for backward pulse an error as represented by the following equation is generated.

$$|tdu\text{-}1\text{-}tdu\text{-}s| \times N$$

This error causes an error to be generated between the external clock signal and the internal clock signal. This problem is applied to a clock synchronization delay control circuit using two delay lines whose directions are opposite similarly to the STBD.

FIGS. 33 to 35A and 35B show another example of the conventional clock synchronization delay control circuit using two or more delay lines that have opposite directions for propagation of a pulse.

In FIG. 33, a delay line for forward pulse 27 and a delay line for backward pulse 28 constitute unit delay units 31 and 32 with NAND circuits and NOR circuits. FIGS. 33 and 34 show a circuit disclosed in Jpn. Pat. Appln. KOKAI Publication No. 11-272356. In this circuit, a NAND circuit and an inverter circuit are used for delay units 4-2 and 5-2 constituting a delay line 4 for forward pulse and a delay line 5 for backward pulse. FIG. 35A shows a circuit disclosed in Jpn. Pat. Appln. KOKAI Publication No. 11-31952. In this circuit, a delay line for forward pulse 6 and a delay line 7 for backward pulse are constituted by delay units 11 and 12. For example the delay line 6 for forward pulse and the delay line 7 for backward pulse are constituted by using a plurality of clocked inverter circuits 31 as shown in FIG. 35B.

FIG. 36A shows a system different from that of the clock synchronization delay control circuit allowing the internal clock signal to be synchronized with the external clock signal in two cycles as shown in FIG. 27. The clock synchronization delay control circuit of this system is constituted by a receiver, a delay monitor, a control circuit, input control circuits, delay units and an output control circuit (serving also as a driver). A delay line 1 and a delay line 2 are constituted by a plurality of delay units provided in a cascade connection. The delay unit for forward pulse and the delay unit for backward pulse shown in FIG. 27 transmit the pulses in only one direction. On the other hand, the delay units constituting the delay lines 1 and 2 shown in FIG. 36A transmit the pulses in both the forward and backward directions. FIG. 36B shows an example of the delay unit shown in FIG. 36A. In the structures shown in FIGS. 36A and 36B, too, an error occurs in the delay time of the delay line due to the displacement of the mask and the irregularity of the process, and thereby the performance is deteriorated.

BRIEF SUMMARY OF THE INVENTION

The present invention is accomplished to solve the above problems and its object is to provide a clock synchronization delay control circuit for restricting a synchronization error caused in the delay line by the displacement of the masking, to a minimum extent.

The object of the present invention can be achieved by the following circuit:

A clock synchronization delay control circuit comprising: a first delay line in which a pulse signal is propagated, the first delay line having a plurality of first delay units; and a second delay line in which a pulse signal is propagated in a direction opposite to the direction of propagation in the first delay line, the second delay line having a plurality of second delay units, wherein the first delay line has a first propagation time, the second delay line has a second propagation time, and an error between the first propagation time and the second propagation time is controlled by symmetrically arranging at least a part of circuit patterns on the plurality of first and second delay units.

The object of the present invention can also be achieved by the following circuit:

A clock synchronization delay control circuit comprising: a first delay line in which a pulse signal is propagated, the first delay line having a first delay unit and a second delay unit; and a second delay line in which a pulse signal is propagated in a direction opposite to the direction of propagation in the first delay line, the second delay line having a third delay unit and a fourth delay unit, wherein each of the first to fourth delay units has an input terminal and an output terminal; a direction from the input terminal to the output terminal in the first and second delay units is set to be parallel to a direction of the first delay line; a direction from the input terminal to the output terminal in the first delay unit is set to be opposite to a direction from the input terminal to the output terminal in the second delay unit; a direction from the input terminal to the output terminal in the third delay unit is set to be opposite to a direction from input terminal to the output terminal in the forth delay unit; a direction from the input terminal to the output terminal in the third and fourth delay units is set to be parallel to a direction of the second delay line; a direction from the input terminal to the output terminal in the first delay unit is set to be opposite to a direction from the input terminal to the output terminal in the third delay unit; and a direction from the input terminal to the output terminal in the second delay unit is set to be opposite to a direction from the input terminal to the output terminal in the fourth delay unit.

According to the present invention, even if the displacement of the mask and the irregularity in the process occur, the synchronization error caused in the delay line can be restricted to a minimum extent. In addition, according to the present invention, the characteristics of the clock synchronization delay control circuit can be enhanced by only improvement of the layout, without changing the process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 22 is a diagram showing a layout of the delay units shown in FIG. 21;

FIG. 35A is a block diagram showing the conventional clock synchronization delay control circuit, and FIG. 35B is a circuit diagram showing essential parts of FIG. 35A.

DETAILED DESCRIPTION OF THE INVENTION

Embodiments of the present invention will be explained below with reference to the drawings.

Figure 1:
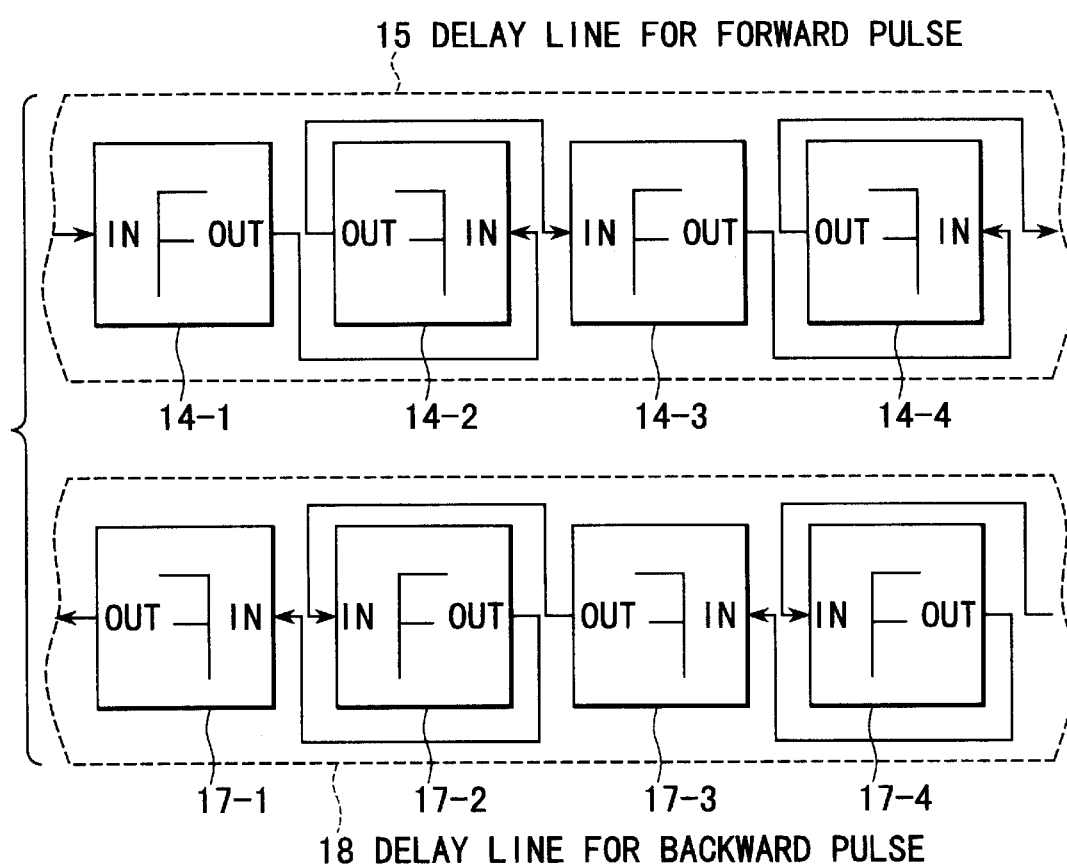
FIG. 1 is a block diagram showing an arrangement of delay units according to a first embodiment of the present invention.
Figure 27:
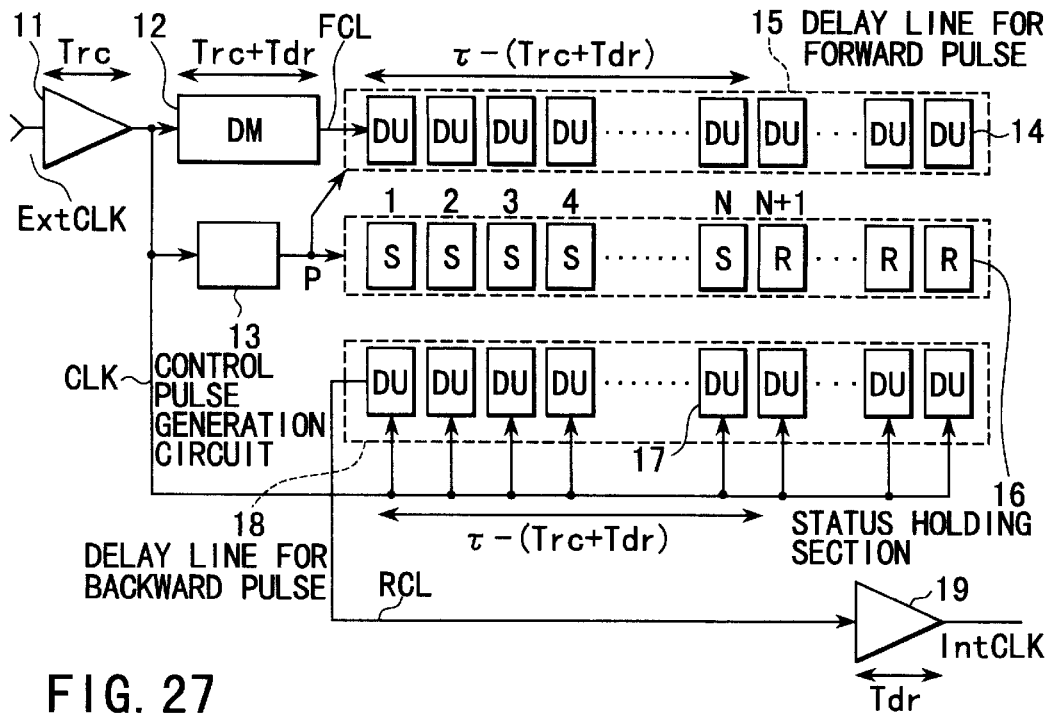
FIG. 27 is a block diagram showing a conventional clock synchronization delay control circuit.
Figure 29:
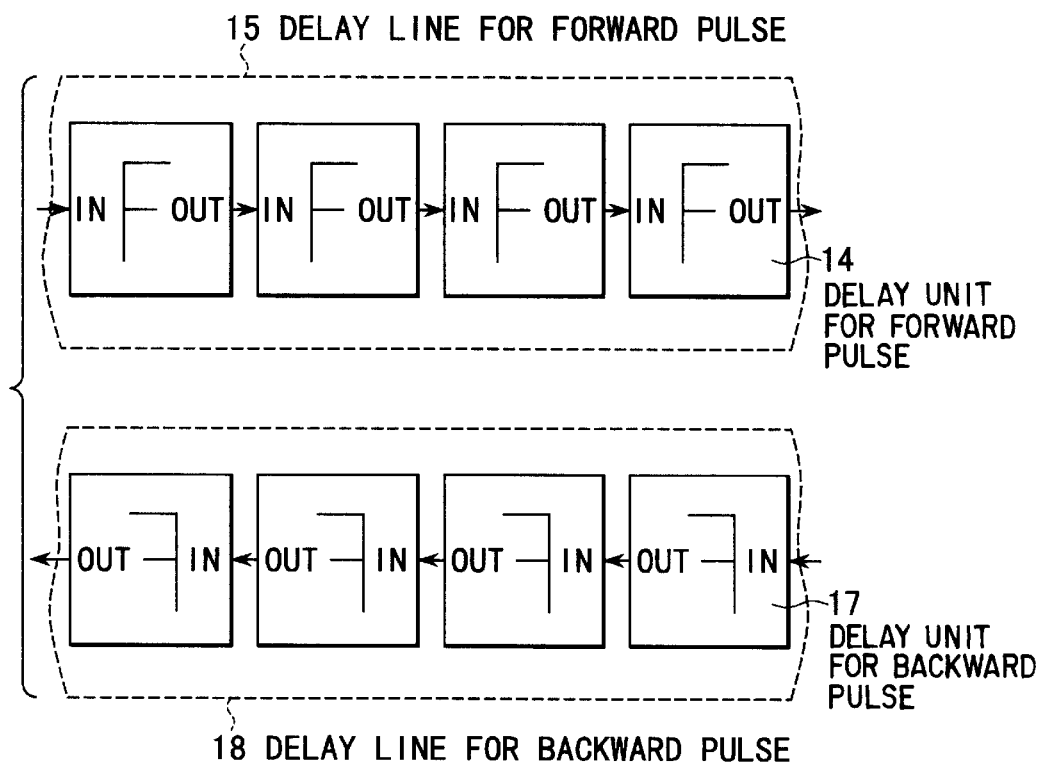
FIG. 29 is a block diagram showing the prior art.
Figure 28:
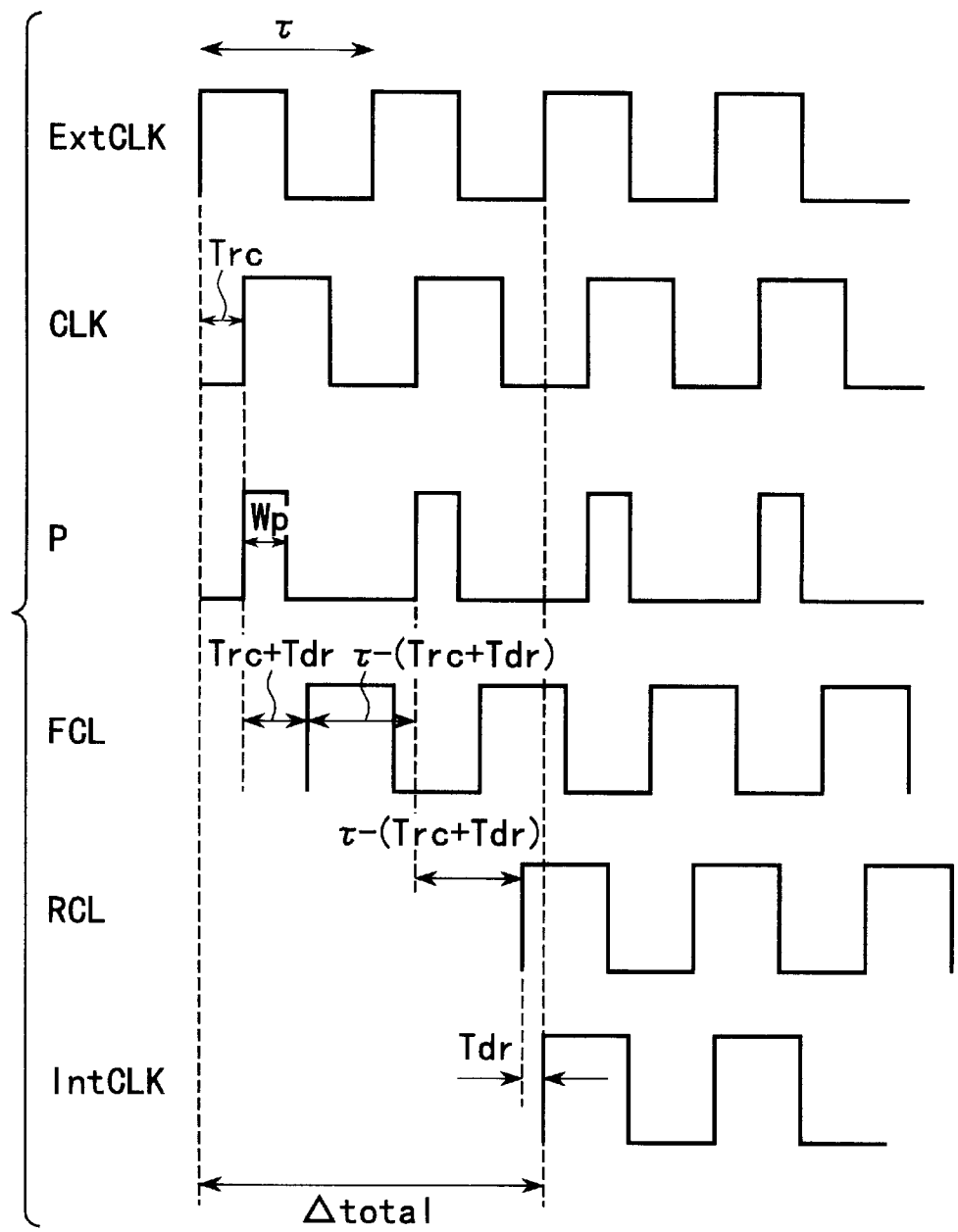
FIG. 28 is a waveforms explaining the operations of the conventional clock synchronization delay control circuit.
Figure 30:
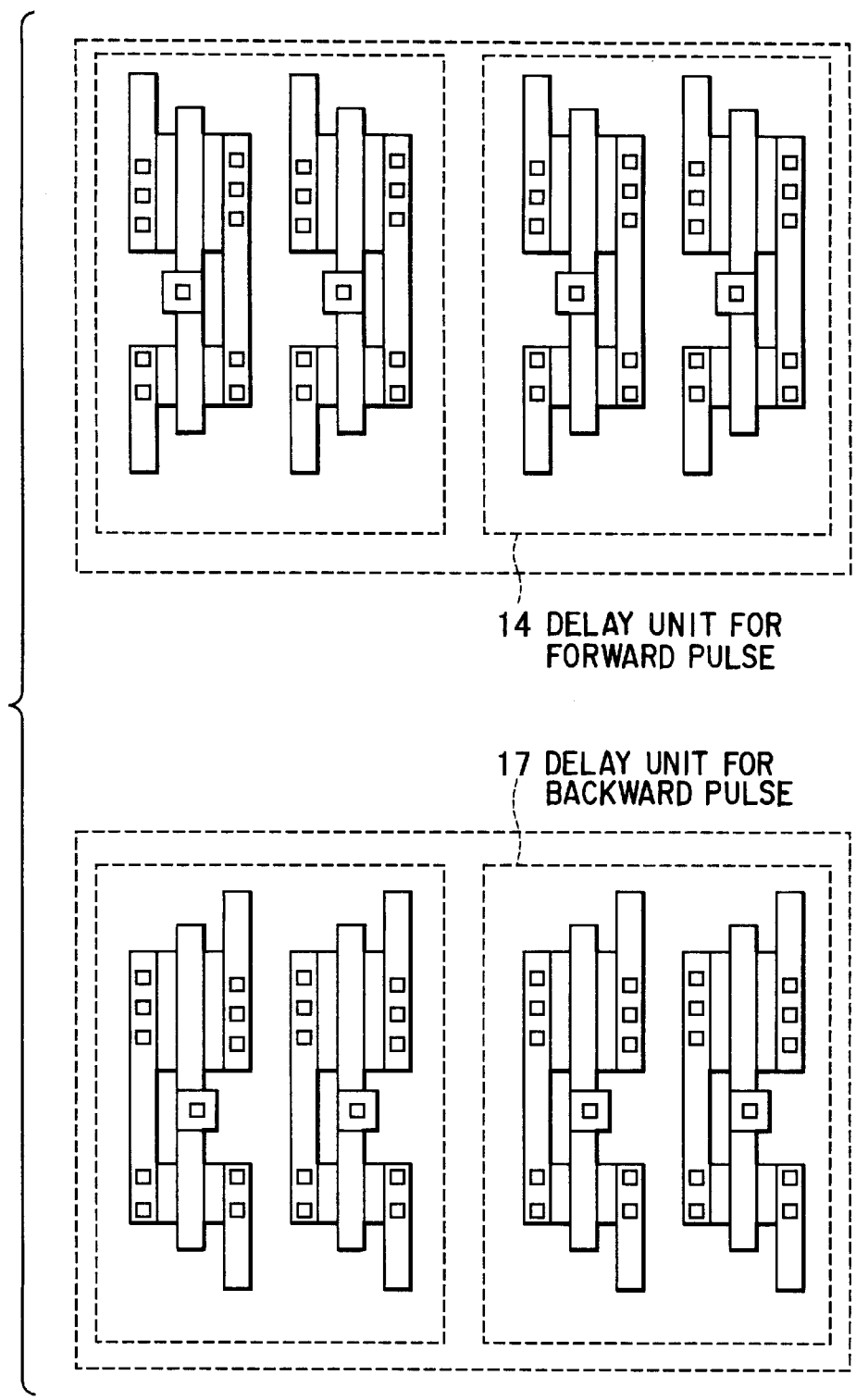
FIG. 30 is a diagram showing a layout to explain in detail the prior art.
Figure 31:
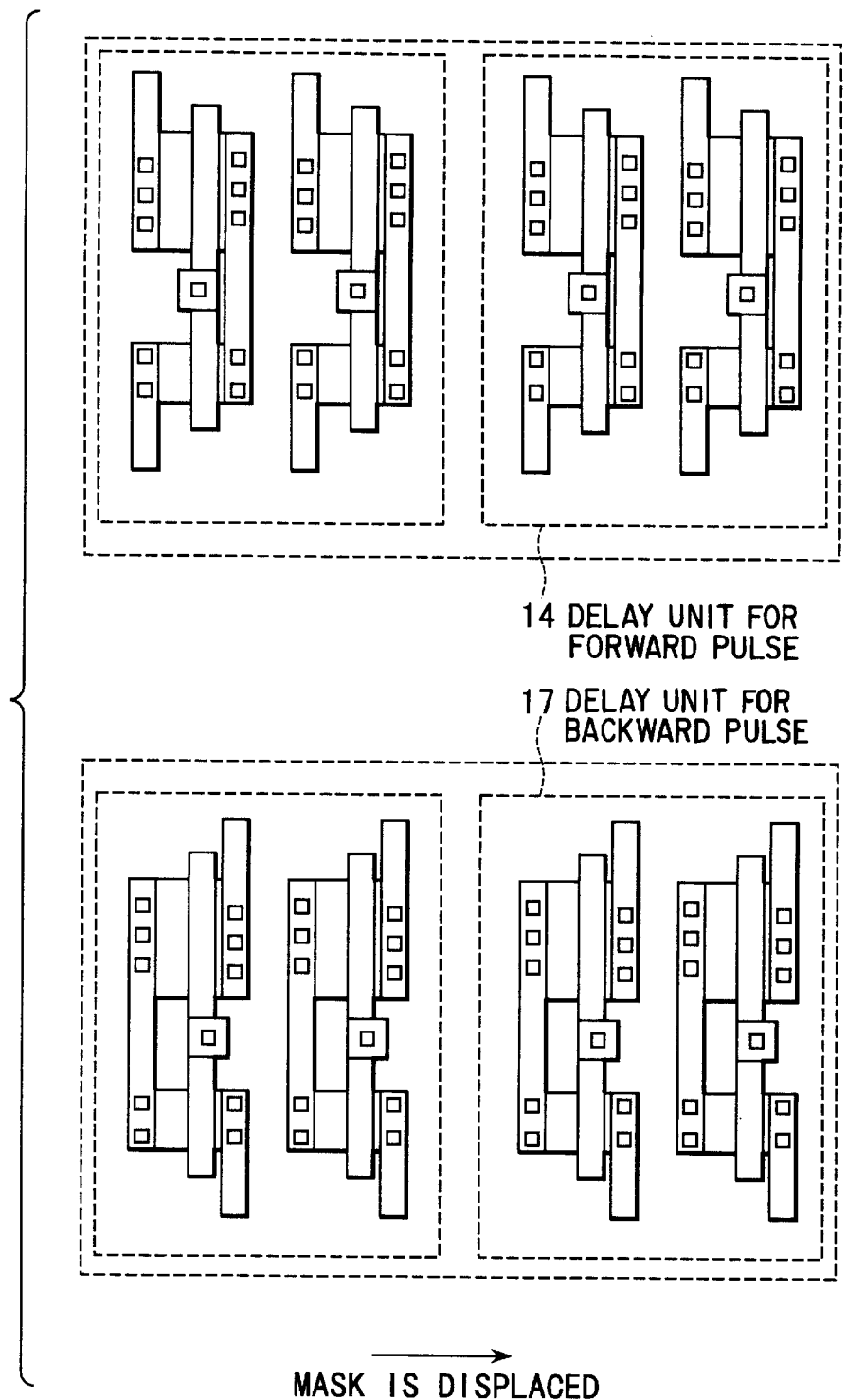
FIG. 31 is a diagram to explain the mask displacement of delay units shown in FIG. 30.
Figure 32:
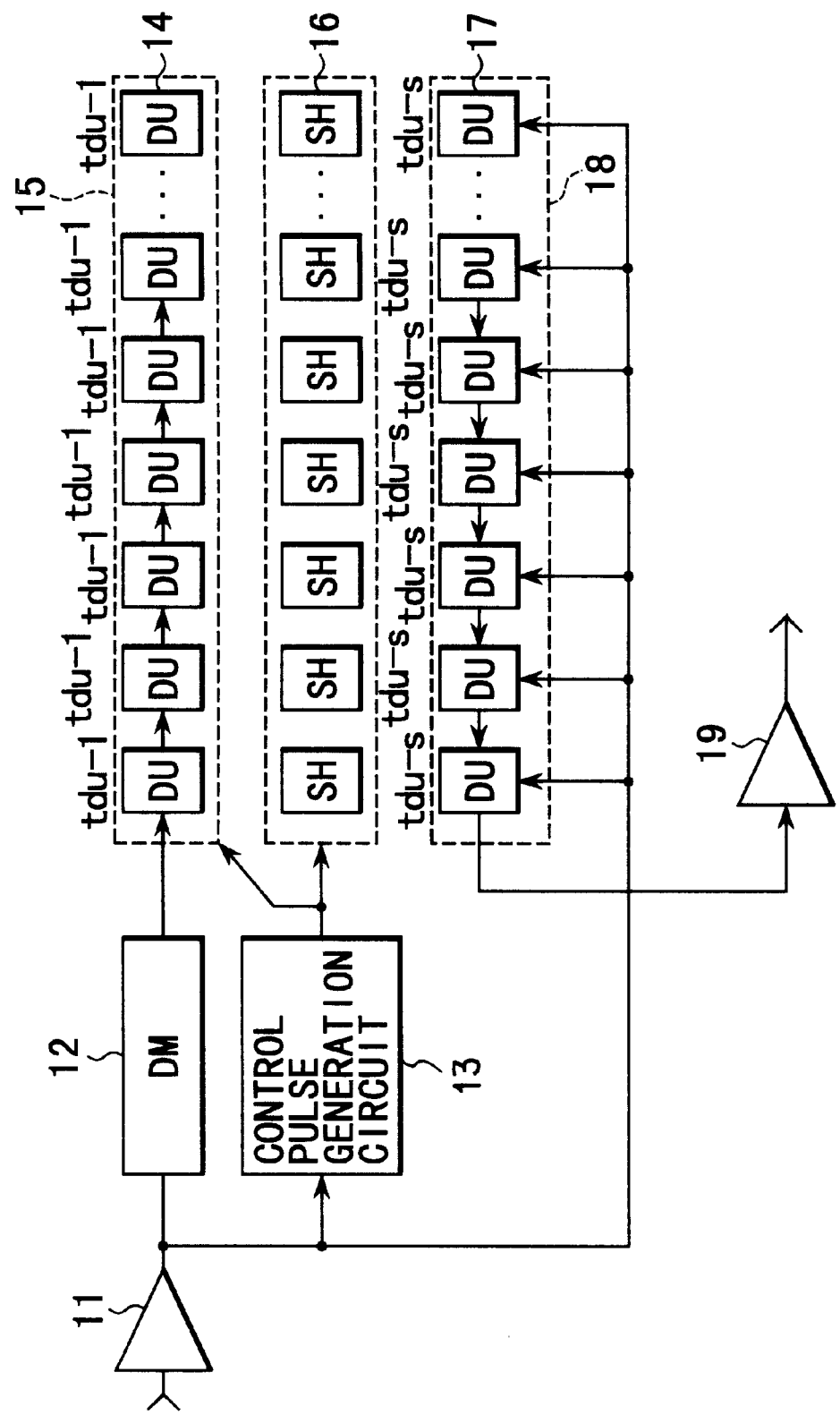
FIG. 32 is a block diagram showing a clock synchronization delay control circuit using the prior art.
Figure 33:
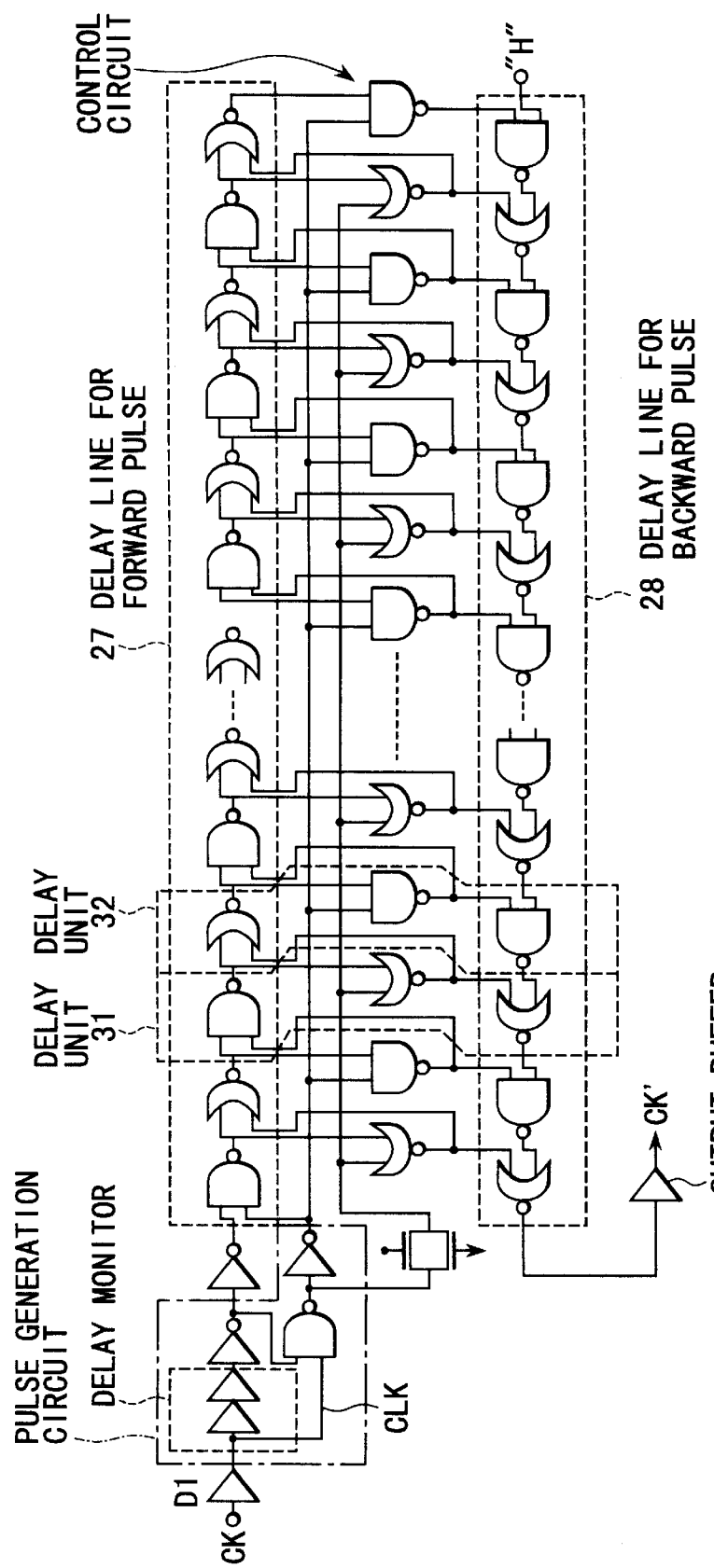
FIG. 33 is a block diagram showing a conventional clock synchronization delay control circuit.
Figure 34:
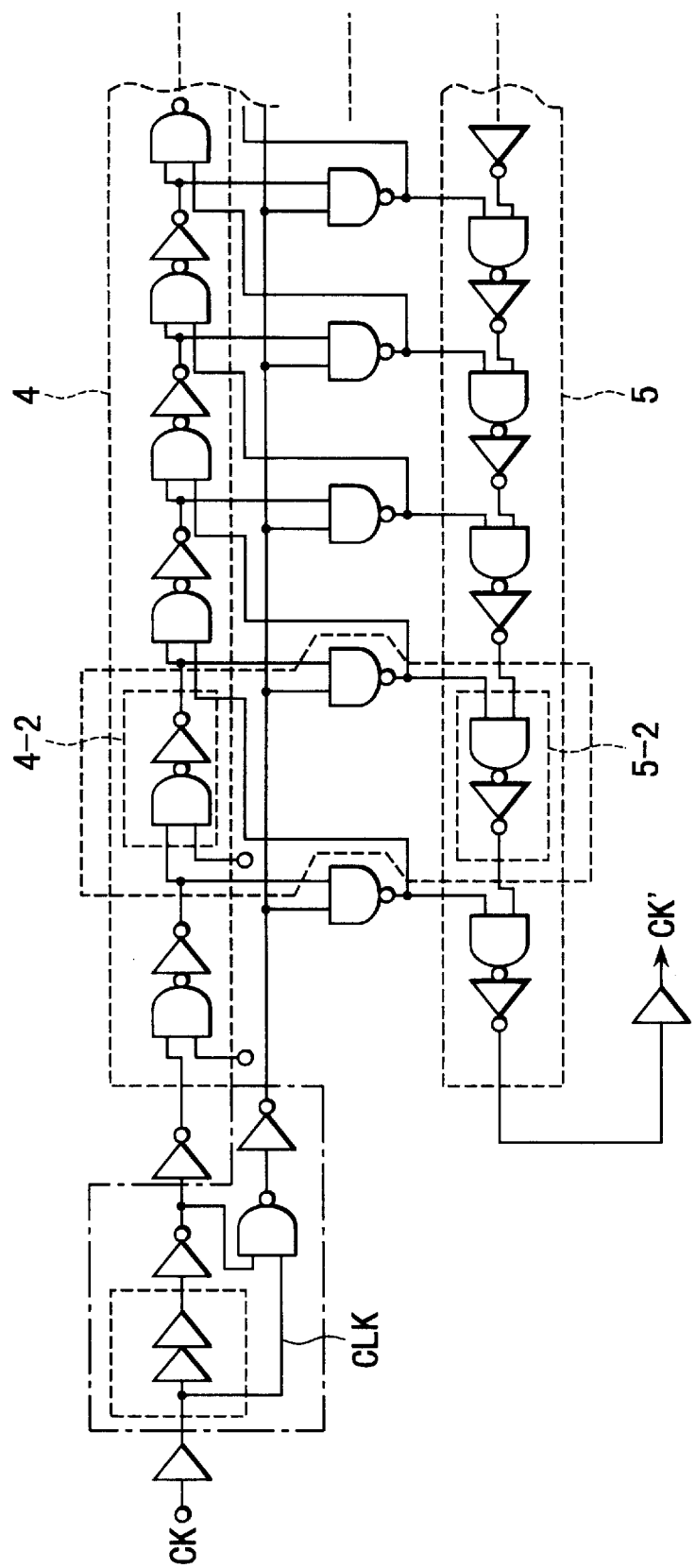
FIG. 34 is a block diagram showing the conventional clock synchronization delay control circuit.
Figure 36A:
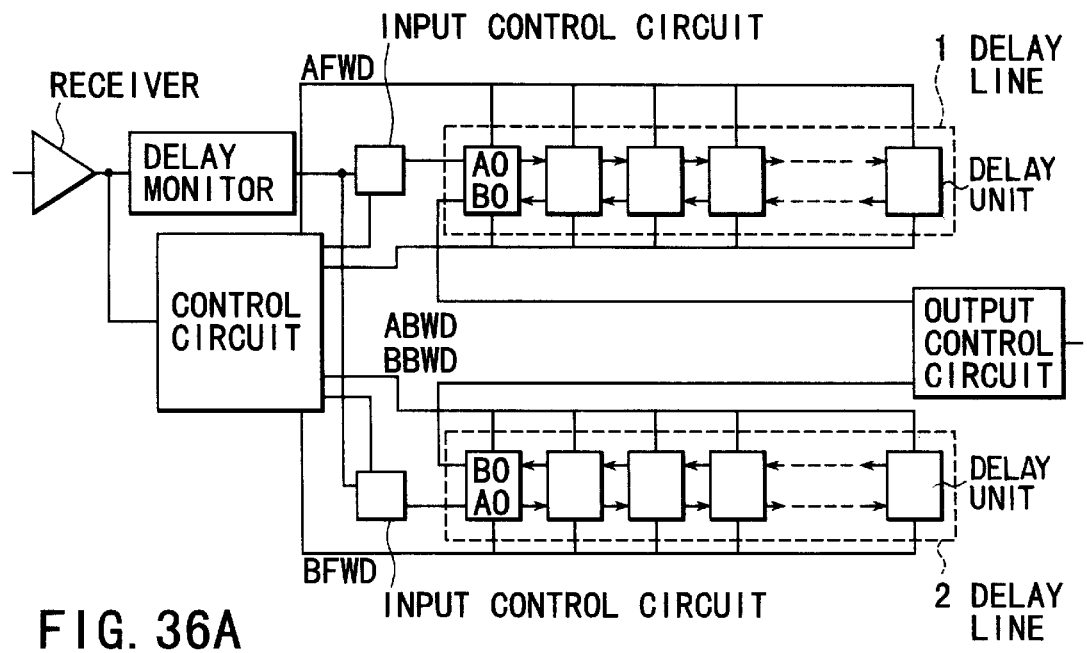
FIG. 36A is a block diagram showing the conventional clock synchronization delay control circuit.
Figure 36B:
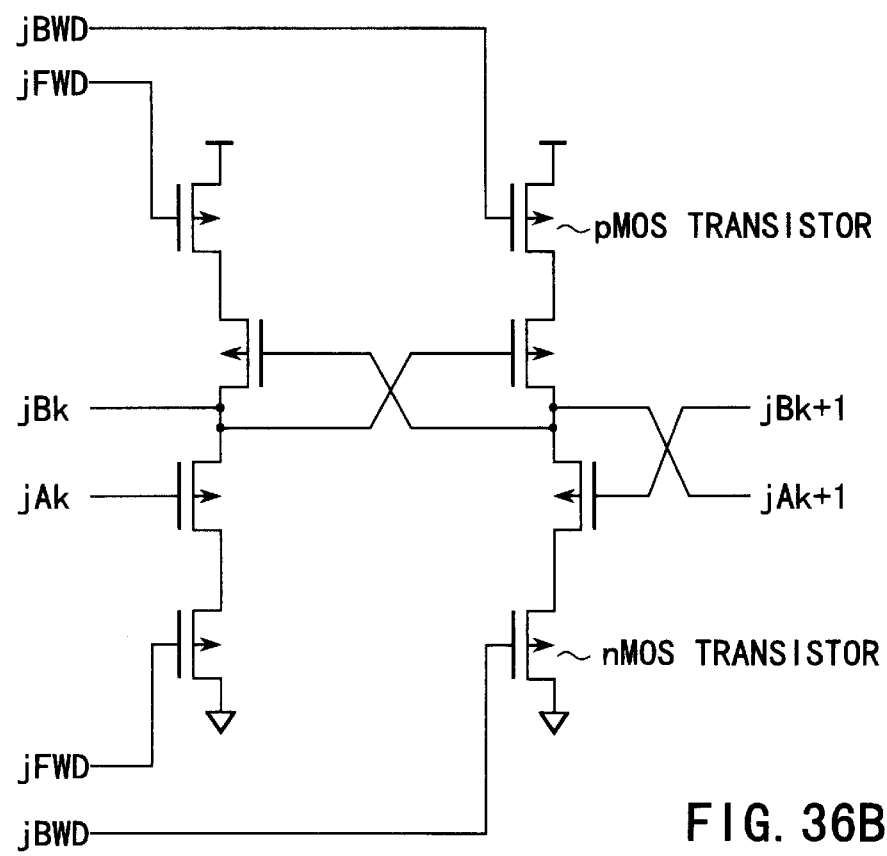
FIG. 36B is a circuit diagram showing a delay unit of FIG. 36A.

FIG. 1 shows a first embodiment of the present invention, illustrating only the essential parts of the delay line 15 for forward pulse and the delay line 18 for backward pulse, for example, in the clock synchronization delay control circuit of FIG. 27. As shown in the figure, the direction from the input terminal IN to the output terminal OUT in each of delay units 14-1 to 14-4 and 17-1 to 17-4 constituting the delay line 15 for forward pulse and the delay line 18 for backward pulse, is in parallel to the direction of the delay lines 15 and 18. Further, the directions from the input terminal IN to the output terminal OUT in two adjacent delay units, of the delay units 14-1 to 14-4 constituting the delay line 15, are opposite to one another. Similarly, the directions from the input terminal IN to the output terminal OUT in two adjacent delay units, of the delay units 17-1 to 17-4 constituting the delay line 18, are opposite to one another. That is, the patterns of adjacent delay units are reversed alternately, similarly to symbols "F" and "rotated F" written in the respective delay units 14-1 to 14-4 and 17-1 to 17-4.

Figure 2:
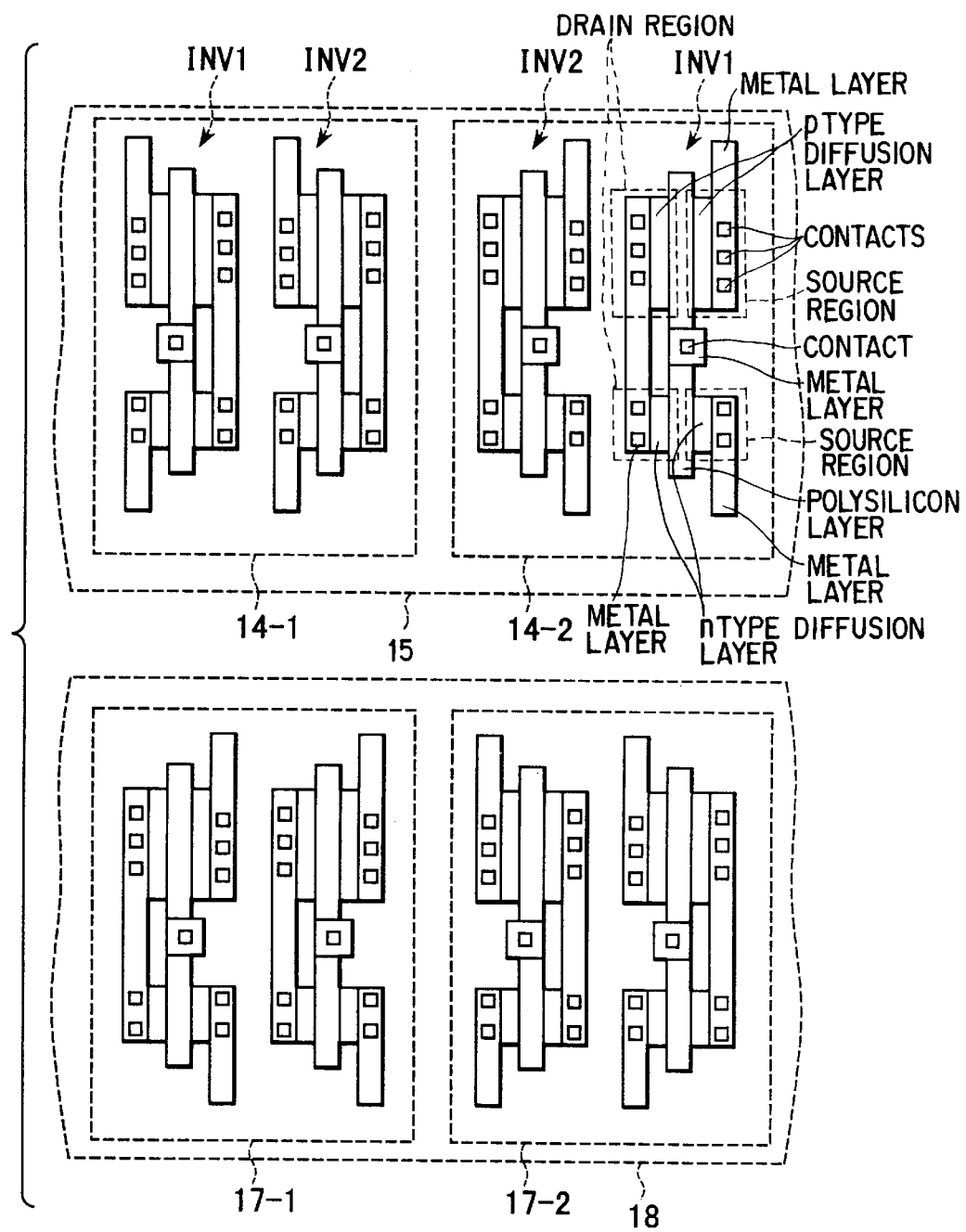
FIG. 2 is a diagram showing a layout of the delay units shown in FIG. 1.

FIG. 2 shows a layout of four delay units 14-1, 14-2, 17-1 and 17-2 shown in FIG. 1. In a case of FIG. 2, each of delay units 14-1, 14-2, 17-1 and 17-2 is constituted by, for example, two inverter circuits INV1 and INV2. As shown in this figure, in the delay line 15 for forward pulse, the pattern of the inverter circuits INV1 and INV2 in the delay unit 14-1 is arranged symmetrically with that of the inverter circuits INV1 and INV2 in the delay unit 14-2, about the boundary line of the delay units 14-1 and 14-2. Similarly, in the delay line 18 for backward pulse, the pattern of the inverter circuits INV1 and INV2 in the delay unit 17-1 is arranged symmetrically with that of the inverter circuits INV1 and INV2 in the delay unit 17-2, about the boundary line of the delay units 17-1 and 17-2. The direction of the channel length of transistors constituting each of the inverter circuits is arranged along the direction of alignment of the delay units.

The layout of the inverter circuit is constituted by n type diffusion layers, p type diffusion layers, a polysilicon layer, metal layers, contacts which connect the metal layers with the diffusion layers and contact which connects the polysilicon layer with the metal layer. Moreover, the dotted lines denote the source region and drain region of each of the MOS transistors, and the polysilicon layer corresponds to a gate of the MOS transistors.

Figure 3:
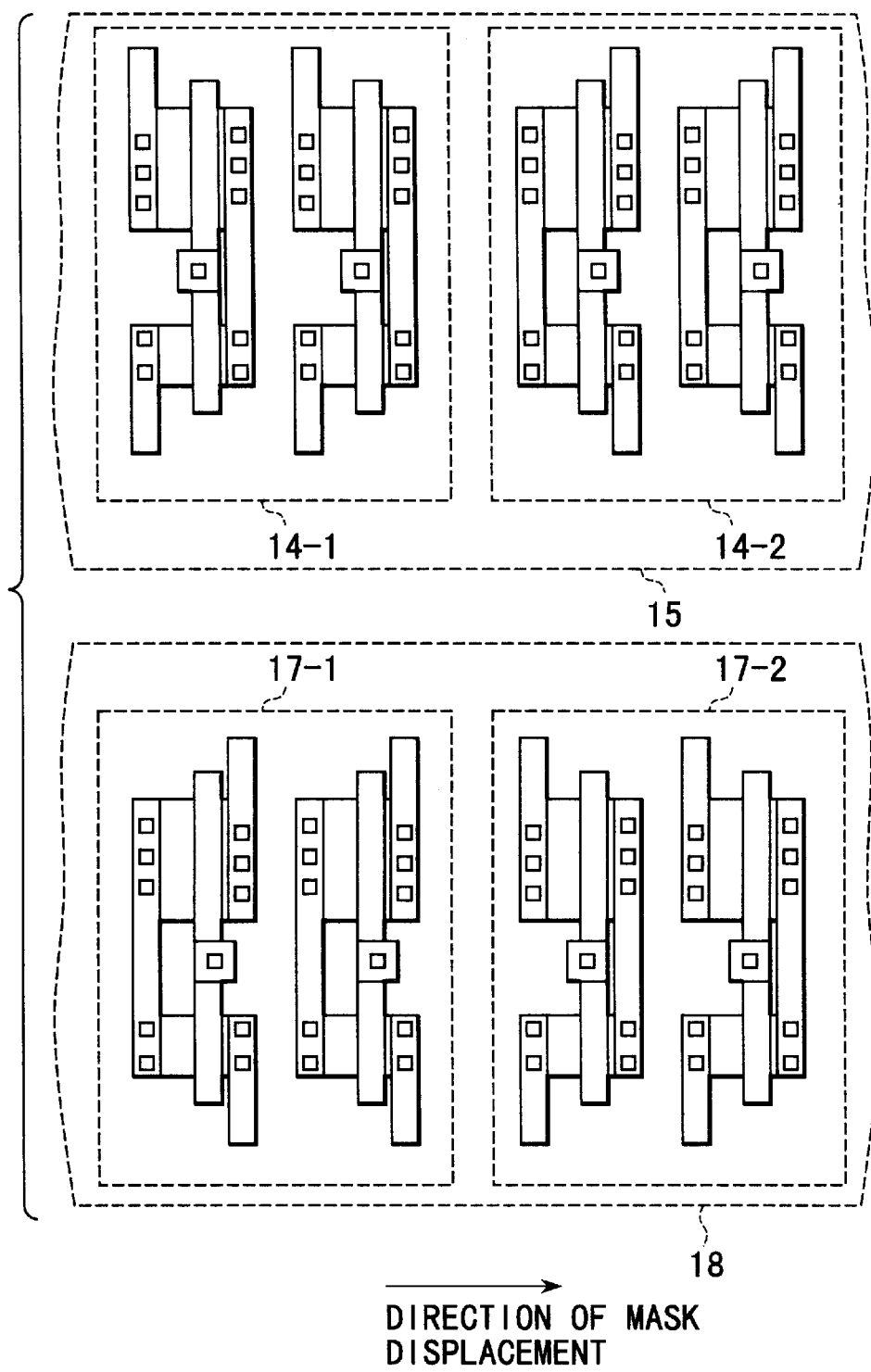
FIG. 3 is a diagram to explain the mask displacement of the delay units shown in FIG. 2.

FIG. 3 shows a case where a mask is displaced in a direction of an arrow or, for example, in the direction of the channel length of the MOS transistors (i.e. a direction from the source area to the drain area), in the layout shown in FIG. 2. In this case, the delay time of the delay unit for forward pulse 14-1 becomes equal to the delay time of the delay unit for backward pulse 17-2, and the delay time of the delay unit for forward pulse 14-2 becomes equal to the delay time of the delay unit for backward pulse 17-1.

Figure 4:
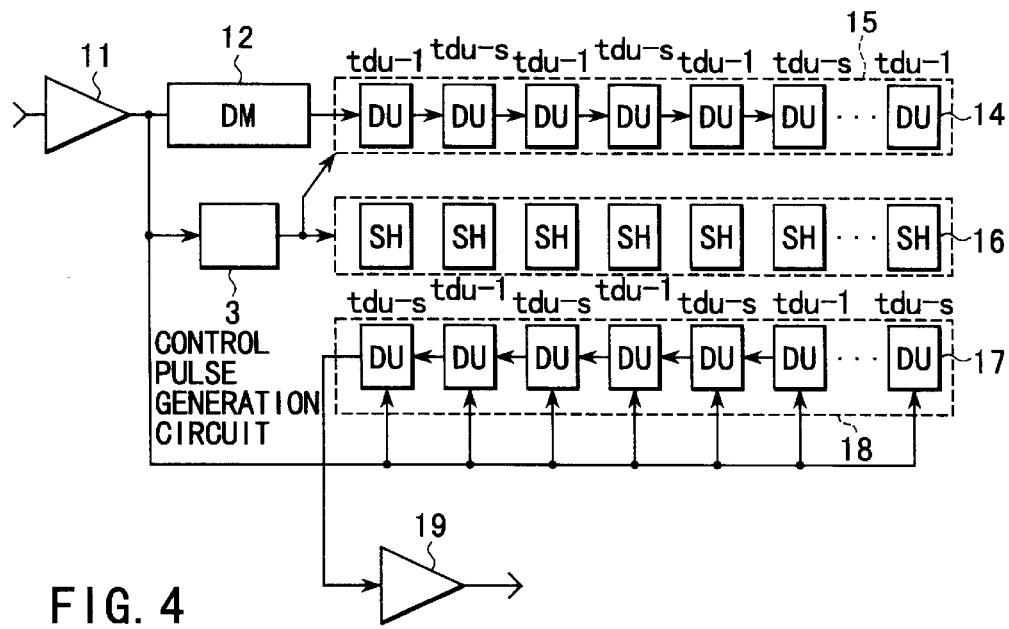
FIG. 4 is a block diagram showing a clock synchronization delay control circuit according to the first embodiment.

FIG. 4 shows a delay time of each delay line in a case where the mask is displaced when the delay units are arranged as shown in FIGS. 1 to 3. When the delay times of adjacent delay units in the delay line 15 for forward pulse are represented respectively by tdu-1 and tdu-s, the delay times tdu-1 and tdu-s in the delay line 15 for forward pulse are alternately generated as shown in FIG. 4. The delay times tdu-s and tdu-1 are also generated alternately in the delay line 18 for backward pulse, similarly to the delay line 15 for forward pulse. In this structure, when it is assumed that a forward pulse signal is propagated up to the N-th stage of the delay line 15 for forward pulse during the time $\tau - (Trc + Tdr)$, total delay time $\Delta f$ in the delay line 15 and total delay time $\Delta b$ in the delay line 18 can be represented in the following equations. (I) If N=2k (k is an integer equal to or larger than 1), $$\Delta f = tdu\text{-}1 \times k + tdu\text{-}s \times k$$

$$\Delta b = tdu\text{-}s \times k + tdu\text{-}1 \times k$$

A difference between the delay times $\Delta f$ and $\Delta b$ is expressed in the following equation (2-1).

$$\Delta f - \Delta b = 0 \tag{2-1}$$

Therefore, no delay time error occurs between the delay line 15 for forward pulse and the delay line 18 for backward pulse.

(II) If N=2k+1 (k is an integer equal to or larger than 0), $$\Delta f = tdu\text{-}1 \times k + tdu\text{-}s \times k + tdu\text{-}1$$

$$\Delta b = tdu\text{-}s \times k + tdu\text{-}1 \times k + tdu\text{-}s$$

A difference between the delay times $\Delta f$ and $\Delta b$ is expressed in the following equation (2-2).

$$\Delta f - \Delta b = tdu\text{-}1 - tdu\text{-}s \tag{2-2}$$

Therefore, the delay time error between the delay line 15 for forward pulse and the delay line 18 for backward pulse is restricted to a minimum extent. Thus, the error is restricted below the error expressed by the equation (2-2) regardless of the number N of the pulse signals propagated to the delay units.

According to the above-described first embodiment, the direction of from the input terminal IN to the output terminal OUT of the delay units constituting the delay line 15 for forward pulse and the delay line 18 for backward pulse is in parallel to the direction of the alignment of the delay units, and the directions from the input terminal IN to the output terminal OUT in two adjacent ones of the delay units are opposite to one another. For this reason, the error of the delay time is not summed up regardless of the number of the delay units to which the pulse signal is propagated.

Further, according to the first embodiment, the characteristics of the clock synchronization delay control circuit can be enhanced without improving the process. In addition, adjacent delay units are symmetrical. For this reason, adjacent delay units can be made the same in the resistance value and the capacity of the wiring.

A second embodiment of the present invention will be explained with reference to FIG. 5. In the present embodiment, the same portions as those of the first embodiment are denoted by the same reference numerals, and only different portions are explained.

Figure 5:
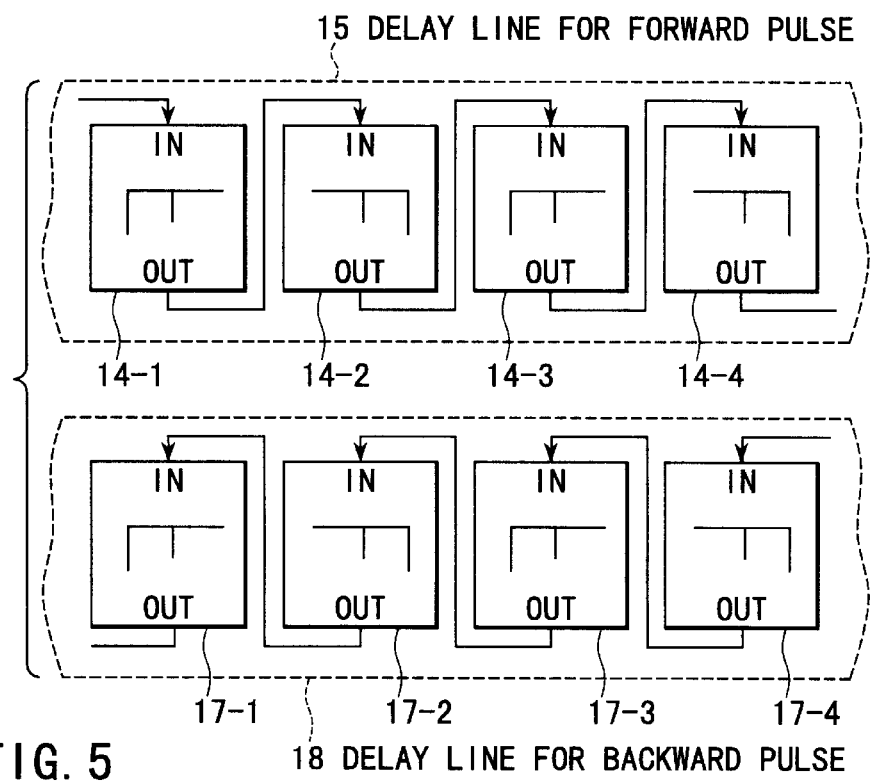
FIG. 5 is a block diagram showing an arrangement of delay units according to a second embodiment of the present invention.

The direction from the input terminal IN to the output terminal OUT in each of delay units 14-1 to 14-4 and 17-1 to 17-4 constituting the delay line 15 for forward pulse and the delay line 18 for backward pulse, is made perpendicular to the direction of the delay lines 15 and 18, as shown in FIG. 5. Further, the directions from the input terminal IN to the output terminal OUT in two adjacent delay units, of the delay units 14-1 to 14-4 constituting the delay line 15, are the same. Similarly, the directions from the input terminal IN to the output terminal OUT in two adjacent delay units, of the delay units 17-1 to 17-4 constituting the delay line 18, are the same. That is, the patterns of the adjacent delay units are reversed alternately, as seen in the symbol "rotated F" written in the respective delay units 14-1 to 14-4 and 17-1 to 17-4.

Figure 6:
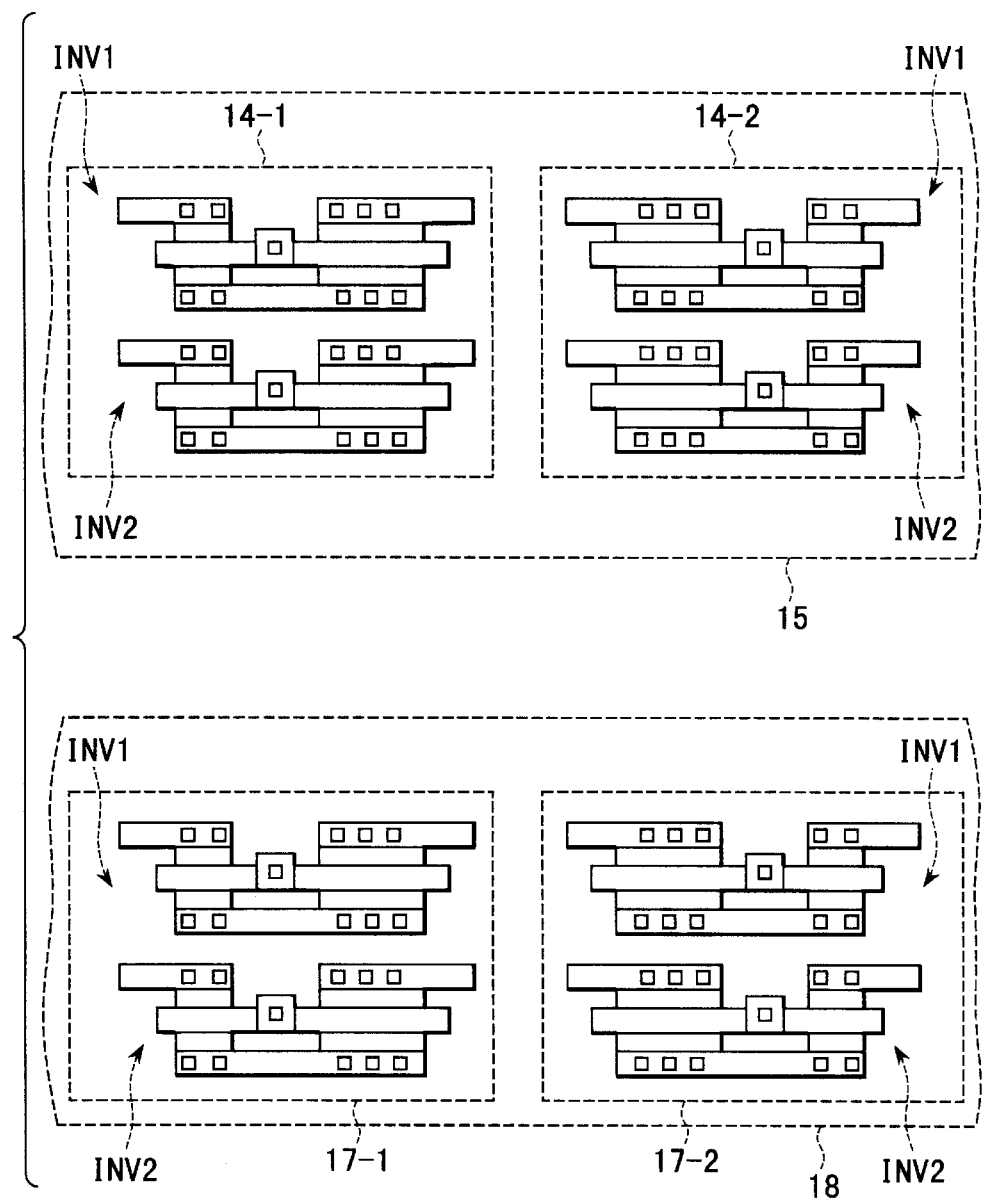
FIG. 6 is a diagram showing a layout of the delay units shown in FIG. 5.

FIG. 6 shows a layout of four delay units 14-1, 14-2, 17-1 and 17-2 shown in FIG. 5. In a case of FIG. 6, each of delay units 14-1, 14-2, 17-1 and 17-2 is constituted by, for example, two inverter circuits INV1 and INV2. As shown in FIG. 6, the direction of the channel length of the transistors constituting each of the inverter circuits is perpendicular to the direction of the alignment of the delay units 14-1, 14-2, 17-1 and 17-2 in the delay lines 15 and 18. In the delay line 15 for forward pulse, the pattern of the inverter circuits INV1 and INV2 in the delay unit 14-1 is arranged symmetrically with that of the inverter circuits INV1 and INV2 in the delay unit 14-2 adjacent to the delay unit 14-1, about the boundary line of the delay units 14-1 and 14-2. In addition, the pattern of the inverter circuits INV1 and INV2 in the delay unit 17-1 is arranged symmetrically with that of the inverter circuits INV1 and INV2 in the delay unit 17-2, about the boundary line of the delay units 17-1 and 17-2.

Figure 7:
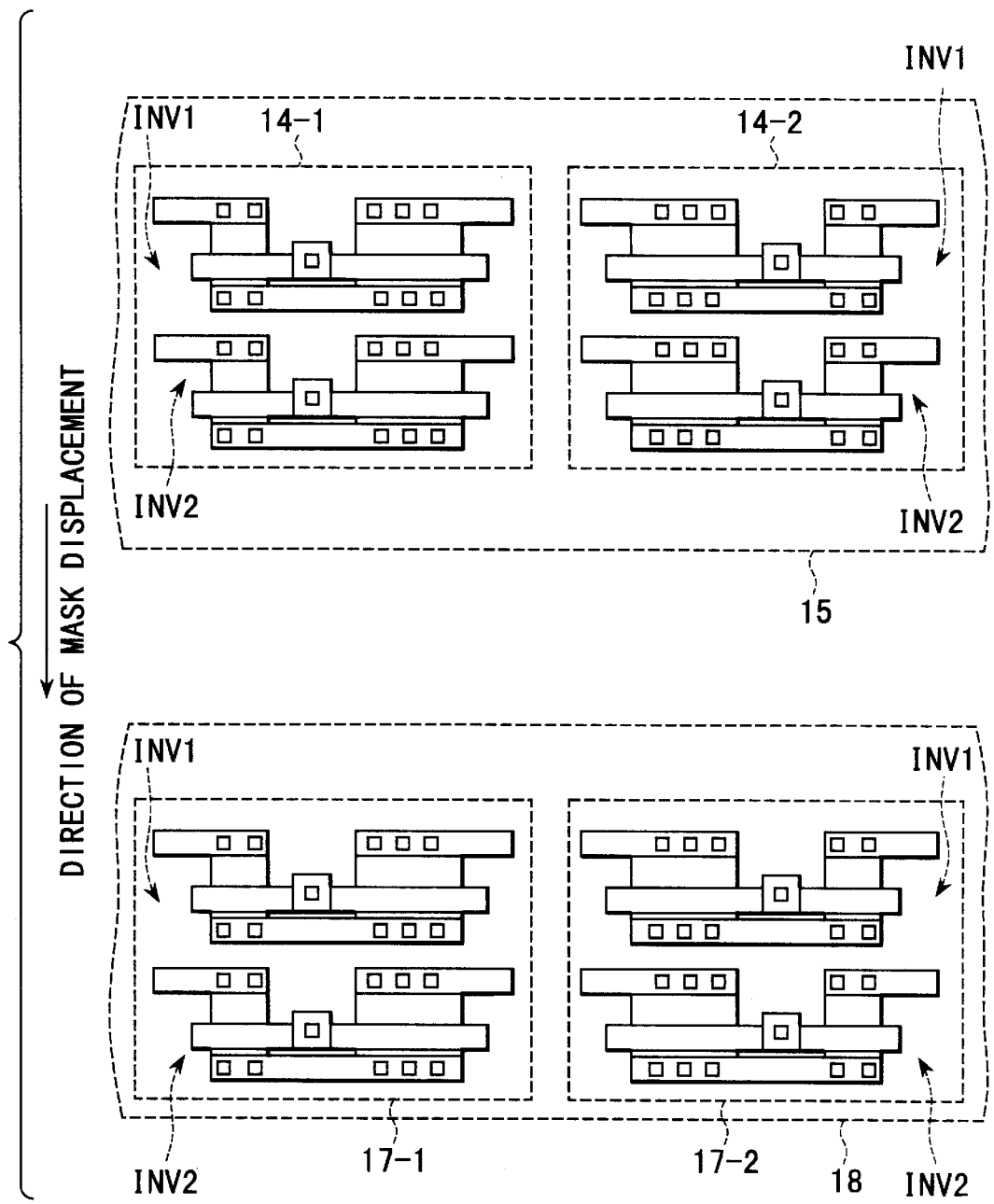
FIG. 7 is a diagram to explain the mask displacement of the delay units shown in FIG. 6.

FIG. 7 shows a case where a mask is displaced in a direction of an arrow or, for example, in the direction of the channel length of the MOS transistors (i.e. a direction from the source area to the drain area), in the layout shown in FIG. 6. In the present embodiment, when the displacement of the mask occurs in the direction of the channel length, the delay times of the delay units become equal to one another since the directions of displacement of the mask in the respective MOS transistors are the same. For this reason, the delay time of the delay line 15 for forward pulse becomes equal to that of the delay line 18 for backward pulse.

Figure 8:
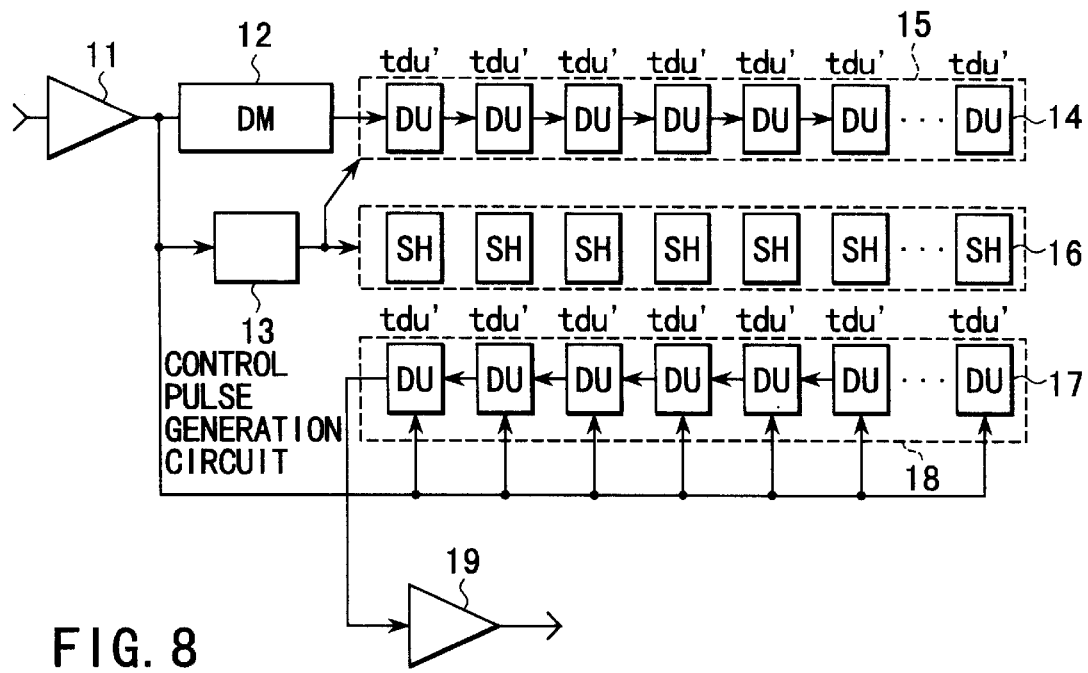
FIG. 8 is a block diagram showing a clock synchronization delay control circuit according to the second embodiment.

FIG. 8 shows a delay time of each delay line in a case where the mask is displaced when the delay units are arranged as shown in FIGS. 5 to 7. In the present embodiment, all the delay times of the delay units become tdu', as shown in FIG. 8. For this reason, the error of the delay time can be made zero regardless of whether the number of delay units to which the pulse signal is propagated is odd or even.

According to the second embodiment, the direction of from the input terminal IN to the output terminal OUT of the delay units constituting the delay line 15 for forward pulse and the delay line 18 for backward pulse is perpendicular to the direction of the alignment of the delay units. The adjacent delay units in the delay lines 15 and 18 are arranged symmetrically with one another about the boundary of the delay units. For this reason, all delay times of the delay units constituting the delay lines 15 and 18 become equal even when the displacement of the mask occurs, and, therefore, the error caused by the difference in the delay times is not generated.

Further, according to the second embodiment, the characteristics of the clock synchronization delay control circuit can be enhanced without improving the process. In addition, the adjacent delay units are symmetrical. For this reason, the adjacent delay units can be made the same in terms of the resistance value and the capacity of the wiring.

A third embodiment of the present invention will be explained with reference to FIG. 9. In the present embodiment, the same portions as those of the first embodiment are denoted by the same reference numerals, and only different portions are explained.

Figure 9:
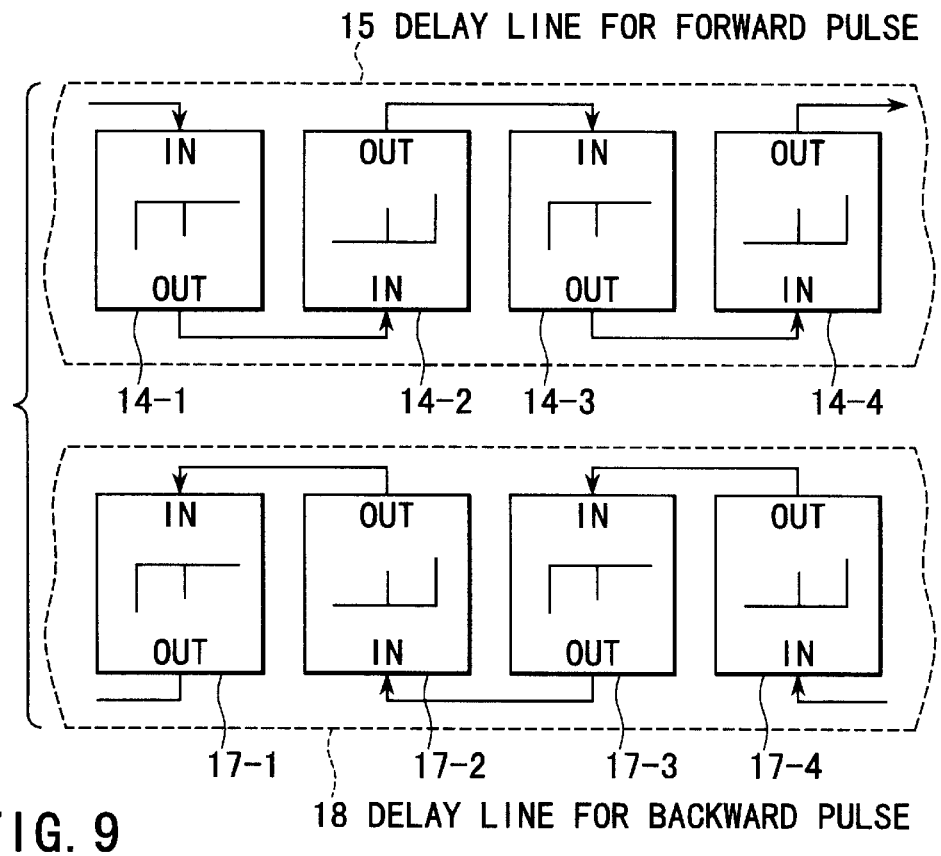
FIG. 9 is a block diagram showing an arrangement of delay units according to a third embodiment of the present invention.

The direction from the input terminal IN to the output terminal OUT in each of delay units 14-1 to 14-4 and 17-1 to 17-4 constituting the delay line 15 for forward pulse and the delay line 18 for backward pulse, is made perpendicular to the direction of the delay lines 15 and 18, as shown in FIG. 9. Further, the directions from the input terminal IN to the output terminal OUT in two adjacent delay units, of the delay units 14-1 to 14-4 constituting the delay line 15, are opposite to one another. Similarly, the directions from the input terminal IN to the output terminal OUT in two adjacent delay units, of the delay units 17-1 to 17-4 constituting the delay line 18, are opposite to one another. That is, the patterns of adjacent delay units are reversed alternately as seen in the symbol "rotated F" written in the respective delay units.

Figure 10:
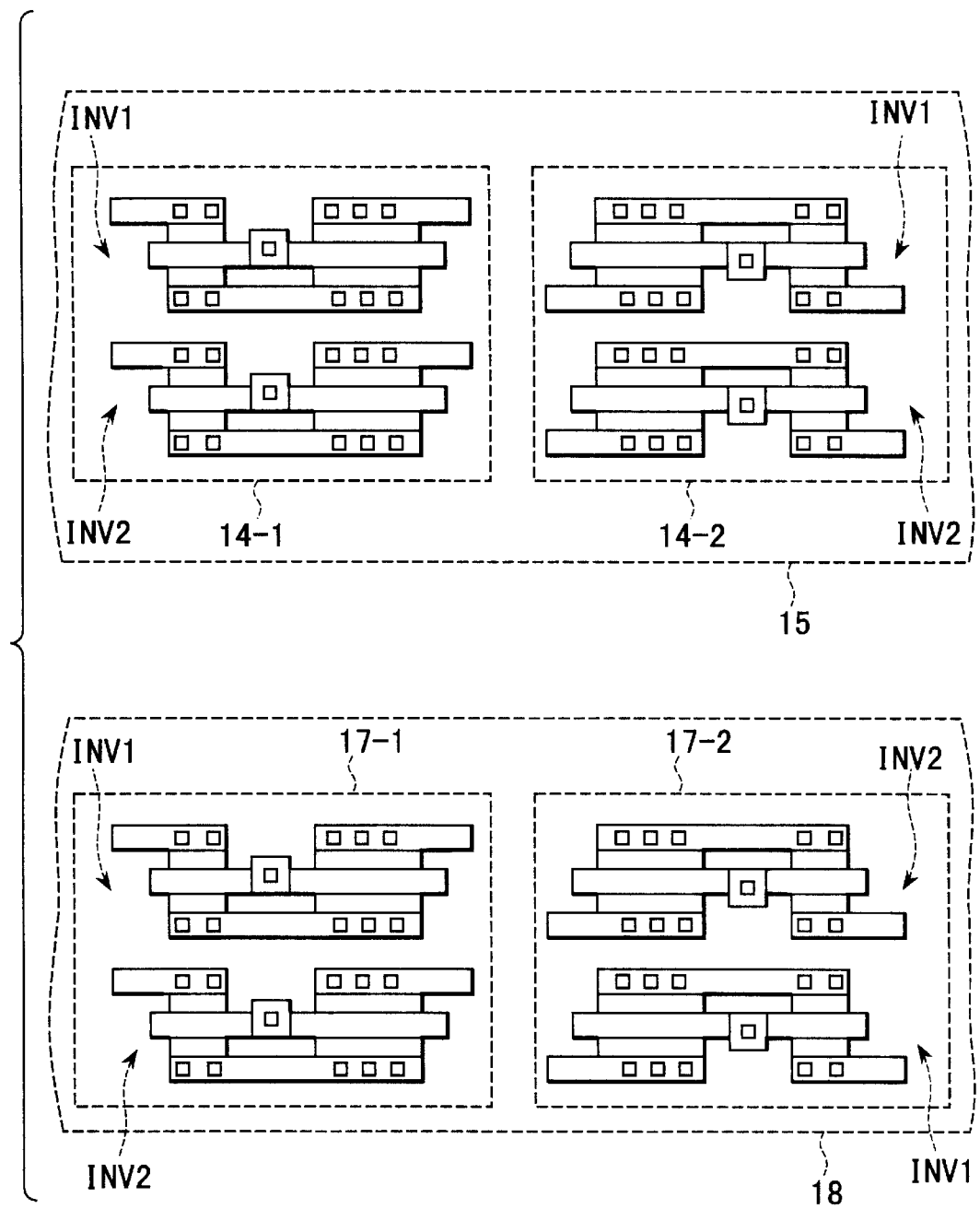
FIG. 10 is a diagram showing a layout of the delay units shown in FIG. 9.

FIG. 10 shows a layout of four delay units 14-1, 14-2, 17-1 and 17-2 shown in FIG. 9. In a case of FIG. 10, each of delay units 14-1, 14-2, 17-1 and 17-2 is constituted by, for example, two inverter circuits INV1 and INV2. As shown in FIG. 10, the direction of the channel length of the transistors constituting each of the inverter circuits is perpendicular to the direction of the alignment of the delay units 14-1, 14-2, 17-1 and 17-2 in the delay lines 15 and 18. In the delay line 15 for forward pulse, the pattern of the inverter circuits INV1 and INV2 in the delay unit 14-1 is arranged symmetrically with respect to a point, with the pattern of the inverter circuits INV1 and INV2 in the delay unit 14-2, about the boundary of the delay units 14-1 and 14-2. Similarly, the layout of the inverter circuits INV1 and INV2 in the delay unit 17-1 is arranged symmetrically with respect to a point, with the layout of the inverter circuits INV1 and INV2 in the delay unit 17-2, about the boundary of the delay units 17-1 and 17-2.

Figure 11:
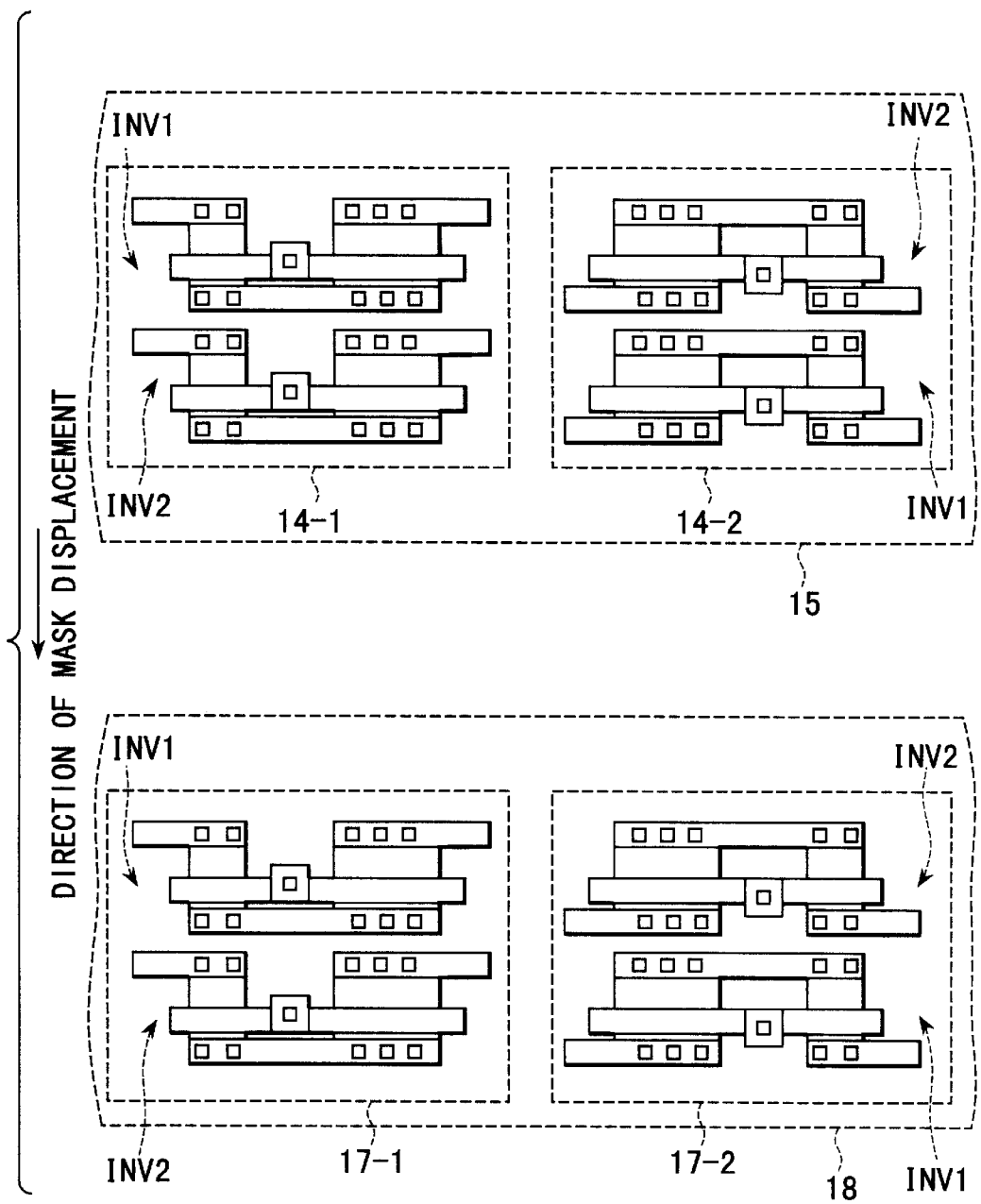
FIG. 11 is a diagram to explain the mask displacement of the delay units shown in FIG. 10.

FIG. 11 shows a case where a mask is displaced in a direction of an arrow or, for example, in the direction of the channel length of the MOS transistors (i.e. a direction from the source area to the drain area), in the layout shown in FIG. 10. In the present embodiment, when the displacement of the mask occurs in the direction of the channel length, the direction in displacement of the pattern of the delay unit 14-1 is the same as that of the delay unit 17-1 and the direction in displacement of the pattern of the delay unit 14-2 is the same as that of the delay unit 17-2, in the delay lines 15 and 18. For this reason, the delay time of the delay line 15 becomes equal to that of the delay line 18.

Figure 12:
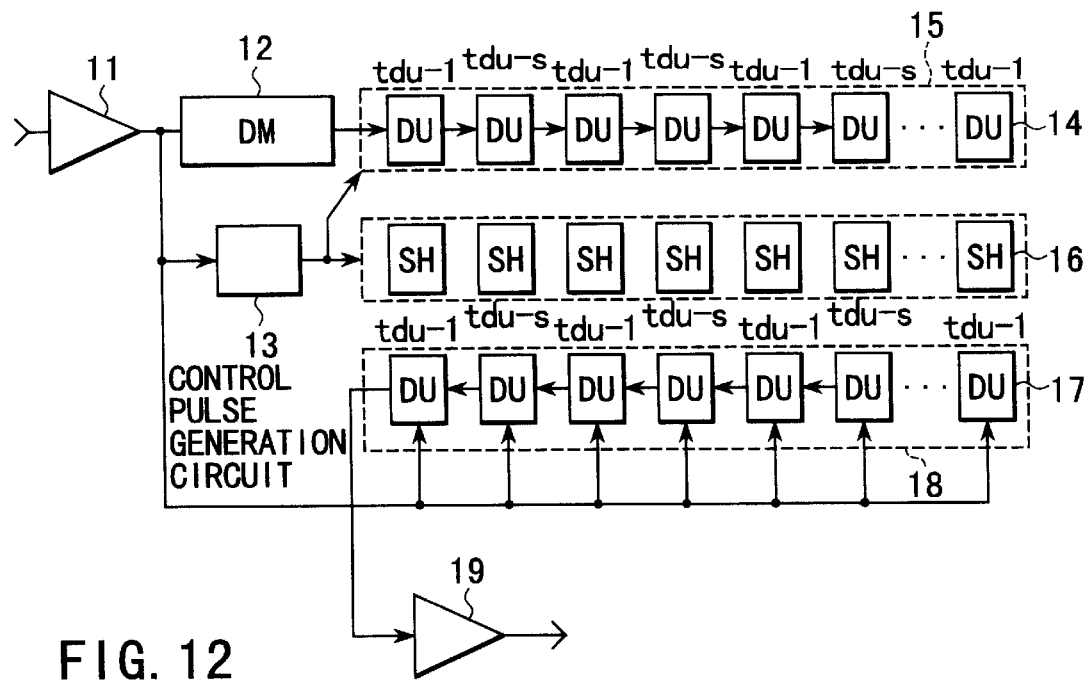
FIG. 12 is a block diagram showing a clock synchronization delay control circuit according to the third embodiment.

FIG. 12 shows a delay time of each delay line in a case where the mask is displaced when the delay units are arranged as shown in FIGS. 5 to 7. In the present embodiment, the delay units having the delay time of tdu-1 and the delay units having the delay time of tdu-s are arranged alternately as shown in FIG. 12. Unlike the first embodiment, the delay times of the delay units at the same stage, of the delay line 15 and in the delay line 18, become equal. In this structure, when it is assumed that a forward pulse signal is propagated up to the N-th stage of the delay line 15 for forward pulse during the time $\tau-(Trc+Tdr)$, the total delay time $\Delta f$ in the delay line 15 for forward pulse and the total delay time $\Delta b$ in the delay line 18 for backward pulse can be represented in the following equations.

(I) If N=2k (k is an integer equal to or larger than 1), $$\Delta f = tdu\text{-}1 \times k + tdu\text{-}s \times k$$

$$\Delta b = tdu\text{-}1 \times k + tdu\text{-}s \times k$$

A difference between the delay times $\Delta f$ and $\Delta b$ is expressed in the following equation (3-1).

$$\Delta f - \Delta b = 0 \qquad (3\text{-}1)$$

Therefore, no delay time error occurs between the delay line 15 for forward pulse and the delay line 18 for backward pulse.

(II) If N=2k+1 (k is an integer equal to or larger than 0), $$\Delta f = tdu\text{-}1 \times k + tdu\text{-}s \times k + tdu\text{-}1$$

$$\Delta b = tdu\text{-}1 \times k + tdu\text{-}s \times k + tdu\text{-}1$$

A difference between the delay times $\Delta f$ and $\Delta b$ is expressed in the following equation (3-2).

$$\Delta f - \Delta b = 0 \qquad (3\text{-}2)$$

Therefore, in this case, also, no delay time error occurs between the delay line 15 for forward pulse and the delay line 18 for backward pulse.

According to the third embodiment, the direction of from the input terminal IN to the output terminal OUT of the delay units constituting the delay line 15 for forward pulse and the delay line 18 for backward pulse is perpendicular to the direction of the alignment of the delay units, and the directions from the input terminal IN to the output terminal OUT in adjacent ones of the delay units are opposite to one another. For this reason, no error occurs in the delay time regardless of the number of the delay units to which the pulse signal is propagated.

When the irregularity occurs in the process, all the delay units constituting the delay line are varied to have the same characteristics in the second embodiment. On the other hand, in the third embodiment, half of the delay units constituting the delay line are varied to have the same characteristics and the rest thereof are varied to have the opposite characteristics. For this reason, in the third embodiment, the influence caused by the irregularity in the process can be more averaged than that in the second embodiment.

Further, according to the third embodiment, the input terminal and the output terminal of the adjacent delay units are positioned more closely than those in the second embodiment. For this reason, the input terminal and the output terminal can be connected more easily and the length of the wiring can be shorter in the third embodiment, as compared with the second embodiment.

According to the third embodiment, the characteristics of the clock synchronization delay control circuit can also be enhanced without improving the process. In addition, the adjacent delay units are symmetrical. For this reason, the adjacent delay units can be designed to have the same wiring resistance and the capacity.

Next, a fourth embodiment of the present invention will be explained with reference to FIG. 13. In the present embodiment, the same portions as those of the first embodiment are denoted by the same reference numerals, and only different portions are explained.

Figure 13:
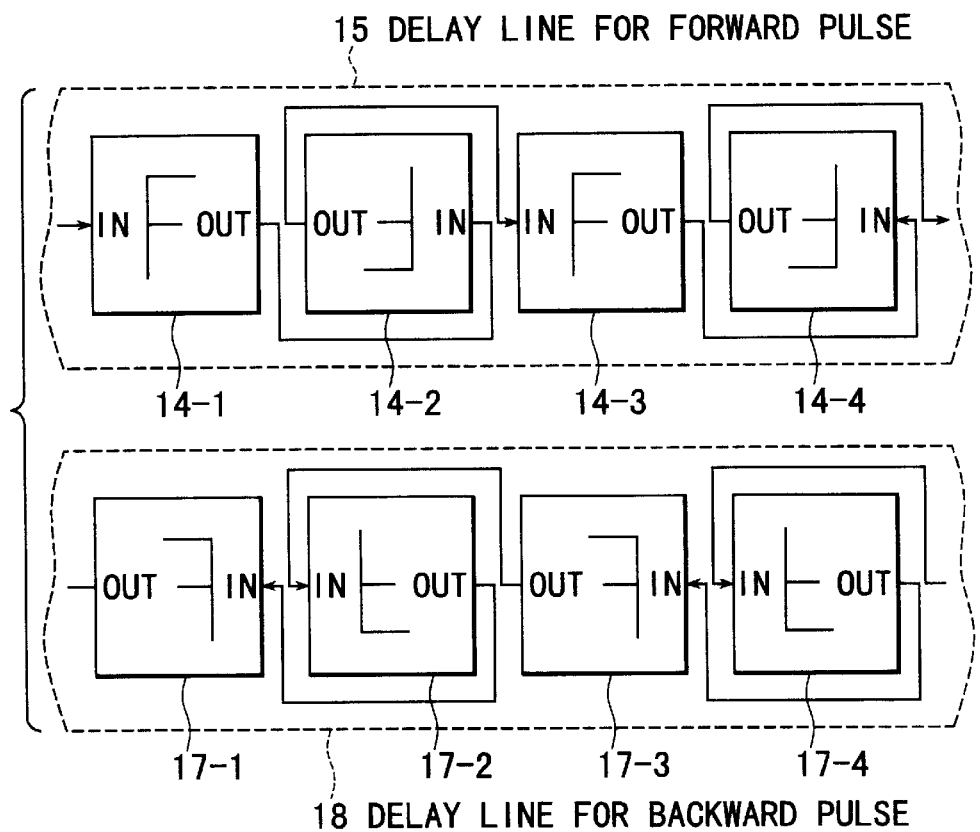
FIG. 13 is a block diagram showing an arrangement of delay units according to a fourth embodiment of the present invention.

The direction from the input terminal IN to the output terminal OUT in each of delay units 14-1 to 14-4 and 17-1 to 17-4 constituting the delay line 15 for forward pulse and the delay line 18 for backward pulse, is in parallel to as the direction of the delay lines 15 and 18, in FIG. 13. The directions from the input terminal IN to the output terminal OUT in two adjacent delay units, of the delay units 14-1 to 14-4 constituting the delay line 15, are opposite to one another. Further, the patterns of adjacent delay units are reversed with one another, as represented by the symbols "F" and "rotated F" written in the delay units 14-1 to 14-4. Similarly, the directions from the input terminal IN to the output terminal OUT in two adjacent delay units, of the delay units 17-1 to 17-4 constituting the delay line 18, are opposite to one another. Moreover, the patterns of adjacent delay units are reversed with one another, as represented by the symbols "F" and "rotated F" written in the delay units 17-1 to 17-4.

Figure 14:
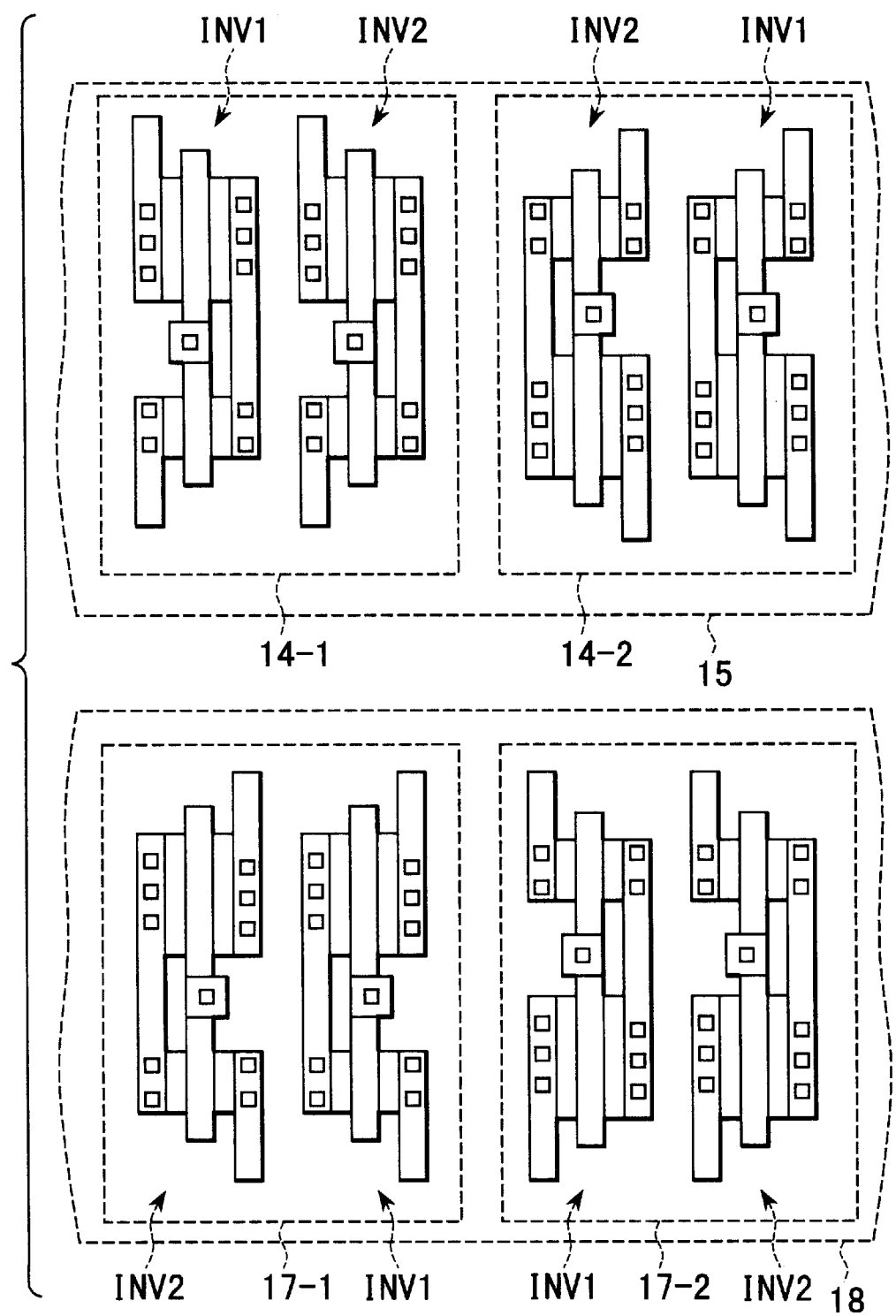
FIG. 14 is a diagram showing a layout of the delay units shown in FIG. 13.

FIG. 14 shows a layout of four delay units 14-1, 14-2, 17-1 and 17-2 shown in FIG. 13. In a case of FIG. 14, each of delay units 14-1, 14-2, 17-1 and 17-2 is constituted by, for example, two inverter circuits INV1 and INV2. In the delay line 15 for forward pulse, the pattern of the inverter circuits INV1 and INV2 in the delay unit 14-1 is arranged symmetrically with respect to a point, with the pattern of the inverter circuits INV1 and INV2 in the delay unit 14-2, about the boundary of the delay units 14-1 and 14-2, as shown in FIG. 14. In the delay line 18 for backward pulse, the pattern of the inverter circuits INV1 and INV2 in the delay unit 17-1 is arranged symmetrically with respect to a point, with that of the inverter circuits INV1 and INV2 in the delay unit 17-2, about the boundary line of the delay units 17-1 and 17-2. The direction of the channel length of transistors constituting each of the inverter circuits is arranged along the direction of alignment of the delay units.

Figure 15:
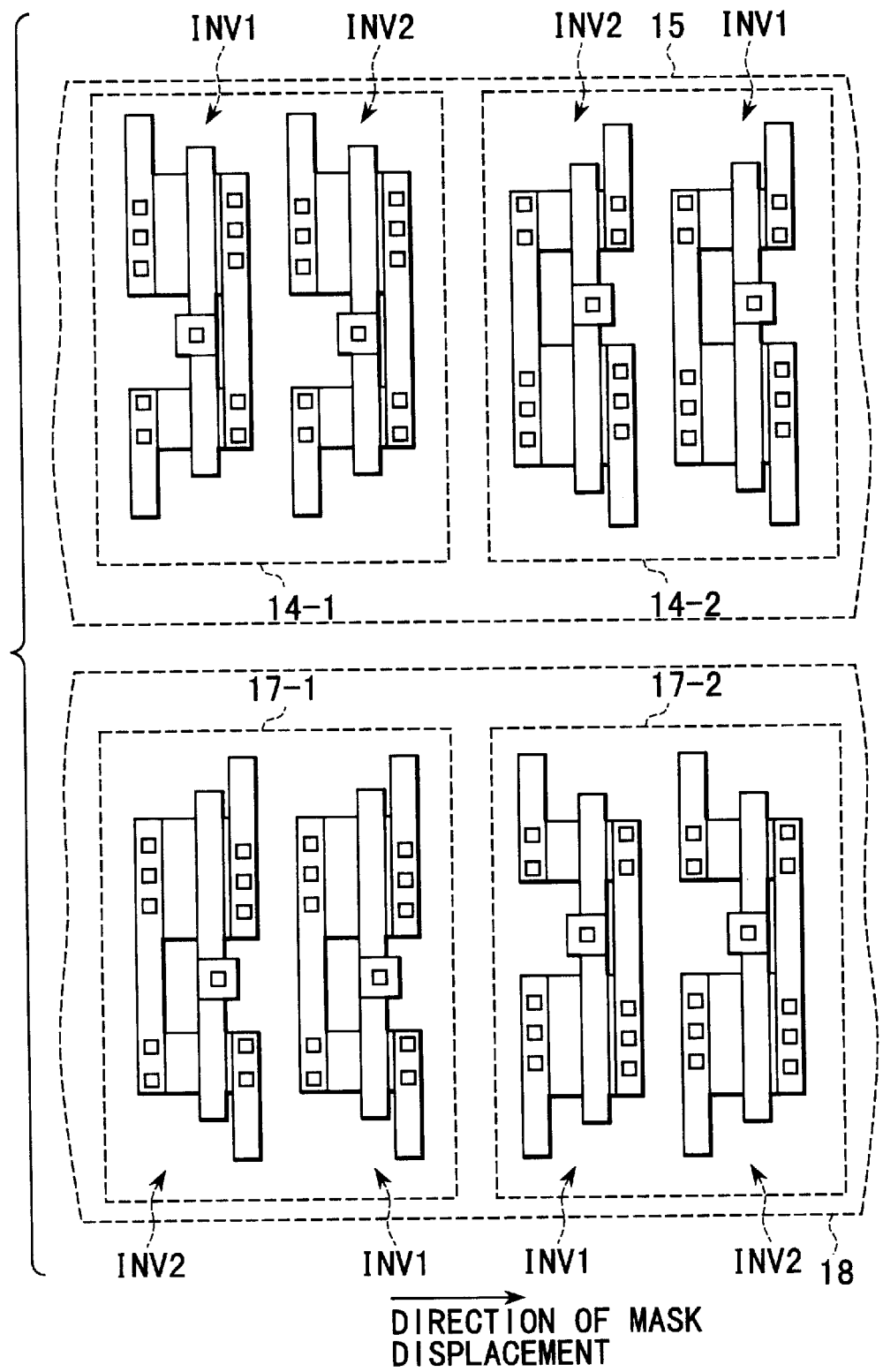
FIG. 15 is a diagram to explain the mask displacement of the delay units shown in FIG. 14.

FIG. 15 shows a case where a mask is displaced in a direction of an arrow or, for example, in the direction of the channel length of the MOS transistors (i.e. a direction from the source area to the drain area), in the layout shown in FIG. 14. In this case, the delay time of the delay unit 14-1 for forward pulse becomes equal to the delay time of the delay unit 17-2 for backward pulse, and the delay time of the delay unit 14-2 for forward pulse becomes equal to the delay time of the delay unit 17-1 for backward pulse.

Figure 16:
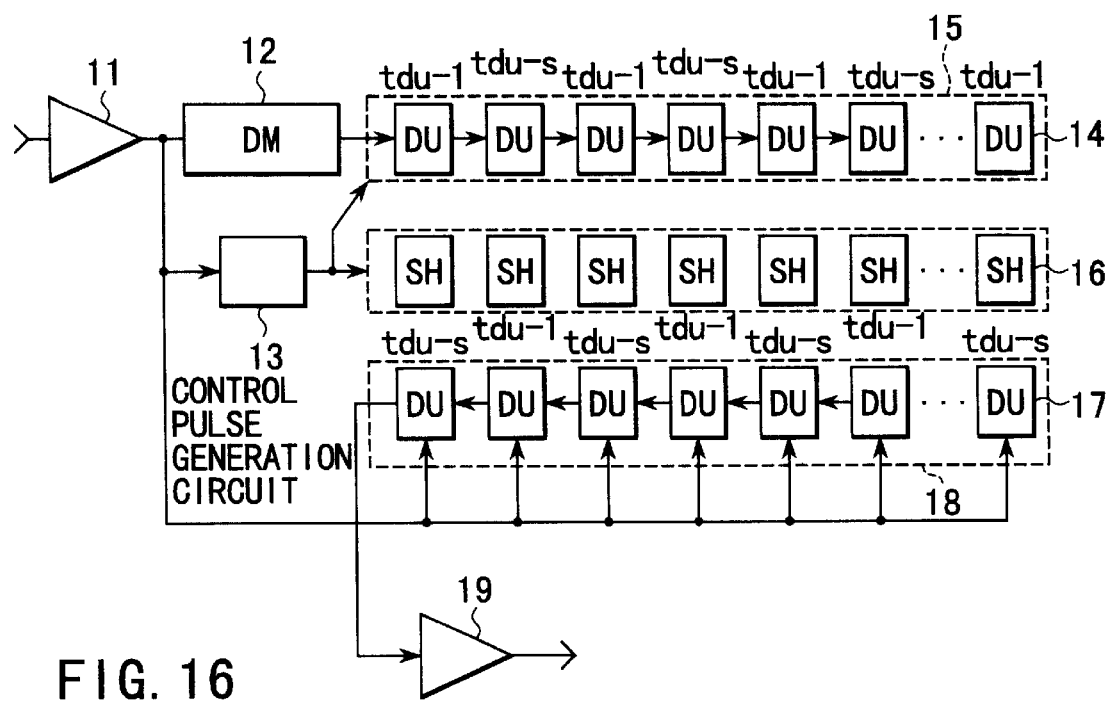
FIG. 16 is a block diagram showing a clock synchronization delay control circuit according to the fourth embodiment.

FIG. 16 shows a delay time of each delay line in a case where the mask is displaced when the delay units are arranged as shown in FIGS. 13 to 15. When the delay times of adjacent delay units in the delay line 15 for forward pulse are represented respectively by tdu-1 and tdu-s, the delay times tdu-1 and tdu-s in the delay line 15 for forward pulse are alternately generated as shown in FIG. 16. The delay times tdu-s and tdu-1 are also generated alternately in the delay line 18 for backward pulse, similarly to the delay line 15 for forward pulse. In this structure, when it is assumed that a forward pulse signal is propagated up to the N-th stage of the delay line 15 for forward pulse during the time $\tau-(Trc+Tdr)$, total delay time $\Delta f$ in the delay line 15 for forward pulse and total delay time $\Delta b$ in the delay line 18 for backward pulse can be represented in the following equations.

(I) If N=2k (k is an integer equal to or larger than 1), $$\Delta f = tdu\text{-}1 \times k + tdu\text{-}s \times k$$

$$\Delta b = tdu\text{-}s \times k + tdu\text{-}1 \times k$$

A difference between the delay times $\Delta f$ and $\Delta b$ is expressed in the following equation (4-1).

$$\Delta f - \Delta b = 0 \tag{4-1}$$

Therefore, no delay time error occurs between the delay line 15 for forward pulse and the delay line 18 for backward pulse.

(II) If N=2k+1 (k is an integer equal to or larger than 0), $$\Delta f = tdu\text{-}1 \times k + tdu\text{-}s \times k + tdu\text{-}1$$

$$\Delta b = tdu\text{-}s \times k + tdu\text{-}1 \times k + tdu\text{-}s$$

A difference between the delay times $\Delta f$ and $\Delta b$ is expressed in the following equation (4-2).

$$\Delta f - \Delta b = tdu\text{-}1 - tdu\text{-}s \tag{4-2}$$

Therefore, the delay time error between the delay line 15 for forward pulse and the delay line 18 for backward pulse is restricted to a minimum extent. Thus, the error is restricted below the error expressed by the equation (4-2) regardless of the number N of the pulse signals propagated to the delay units.

According to the fourth embodiment, the direction of from the input terminal IN to the output terminal OUT of the delay units constituting the delay line 15 for forward pulse and the delay line 18 for backward pulse is in parallel to the direction of the alignment of the delay units, and the directions from the input terminal IN to the output terminal OUT in two adjacent ones of the delay units are opposite to one another. Further, the patterns of the adjacent delay units are reversed alternately. For this reason, the error of the delay time is not summed up regardless of the number of the delay units to which the pulse signal is propagated, similarly to the first embodiment.

Further, the characteristics of the clock synchronization delay control circuit can be enhanced without improving the process. In addition, adjacent delay units are symmetrical. For this reason, adjacent delay units can be made the same in the resistance value and the capacity of the wiring.

Next, a fifth embodiment of the present invention will be explained with reference to FIG. 17. In the present embodiment, the same portions as those of the first embodiment are denoted by the same reference numerals, and only different portions are explained.

Figure 17:
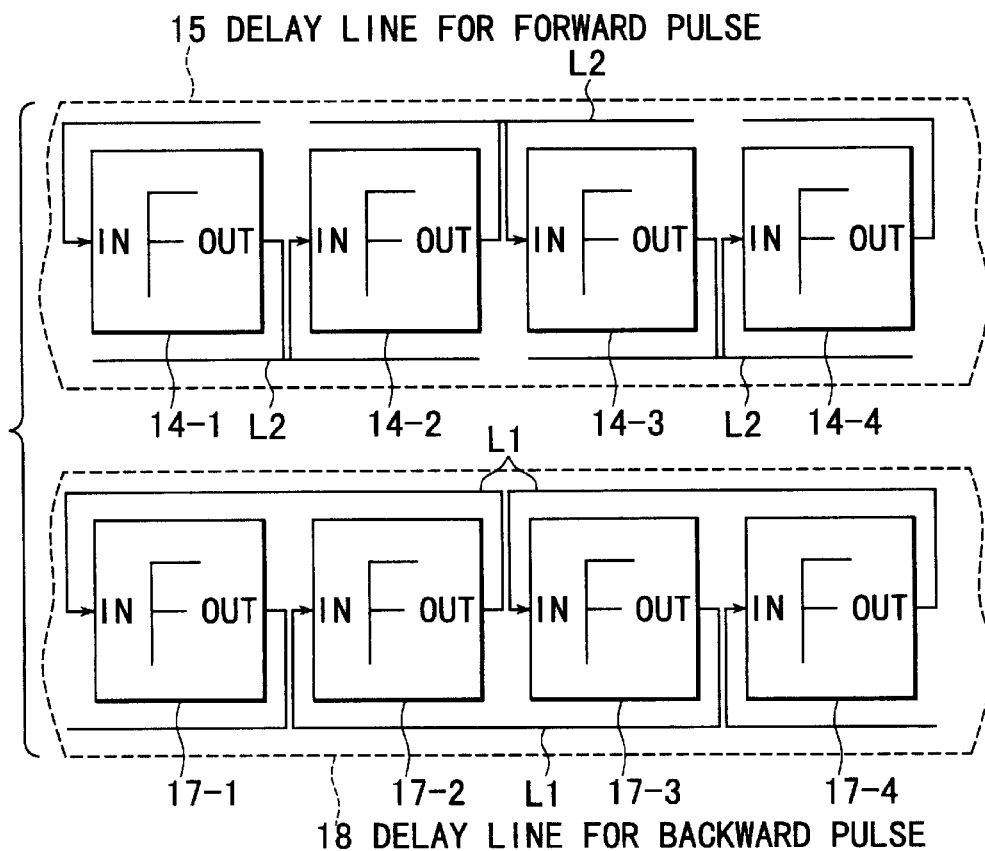
FIG. 17 is a block diagram showing an arrangement of delay units according to a fifth embodiment of the present invention.

The direction from the input terminal IN to the output terminal OUT in each of delay units 14-1 to 14-4 and 17-1 to 17-4 constituting the delay line 15 for forward pulse and the delay line 18 for backward pulse, is made in parallel to the direction of the delay lines 15 and 18, as shown in FIG. 17. Further, the directions from the input terminal IN to the output terminal OUT in two adjacent delay units, of the delay units 14-1 to 14-4 constituting the delay line 15, are the same. Similarly, the directions from the input terminal IN to the output terminal OUT in two adjacent delay units, of the delay units 17-1 to 17-4 constituting the delay line 18, are the same. In the delay line 15 for forward pulse, the direction of the arrangement of the input terminal IN and the output terminal OUT in each of the delay units 14-1 to 14-4 is made the same as the direction of propagation of the forward pulse signal. On the other hand, in the delay line 18 for backward pulse, the direction of the arrangement of the input terminal IN and the output terminal OUT in each of the delay units 17-1 to 17-4 is opposite to the direction of propagation of the backward pulse signal. In the delay line 15 for forward pulse, the input terminal IN and the output terminal OUT of the delay units 14-1 to 14-4 are sequentially connected by wiring L1 so as to correspond to the direction of propagation of the forward pulse signal. On the other hand, in the delay line 18 for backward pulse, the input terminal IN and the output terminal OUT of the delay units 17-1 to 17-4 are sequentially connected by wiring L2 so as to correspond to the direction of propagation of the backward pulse signal.

In the present embodiment, the distance between the input terminal IN and the output terminal OUT of the delay units 14-1 to 14-4 for the forward pulse is different from the distance between the input terminal IN and the output terminal OUT of the delay units 17-1 to 17-4 for the backward pulse. For this reason, the length of the wiring L2 connected to the delay units 17-1 to 17-4 is different from the length of the wiring L1 connected to the delay units 14-1 to 14-4. Therefore, the resistance value of the wiring L1 is different from the resistance value of the wiring L2. However, the resistance value of the wiring influences more than the capacity, as the factor that determines the delay time of the wiring. For this reason, the capacity of the wiring L1 and that of the wiring L2 are set to be equal and the delay times of the wirings L1 and L2 are made substantially the same in the present embodiment.

Figure 18:
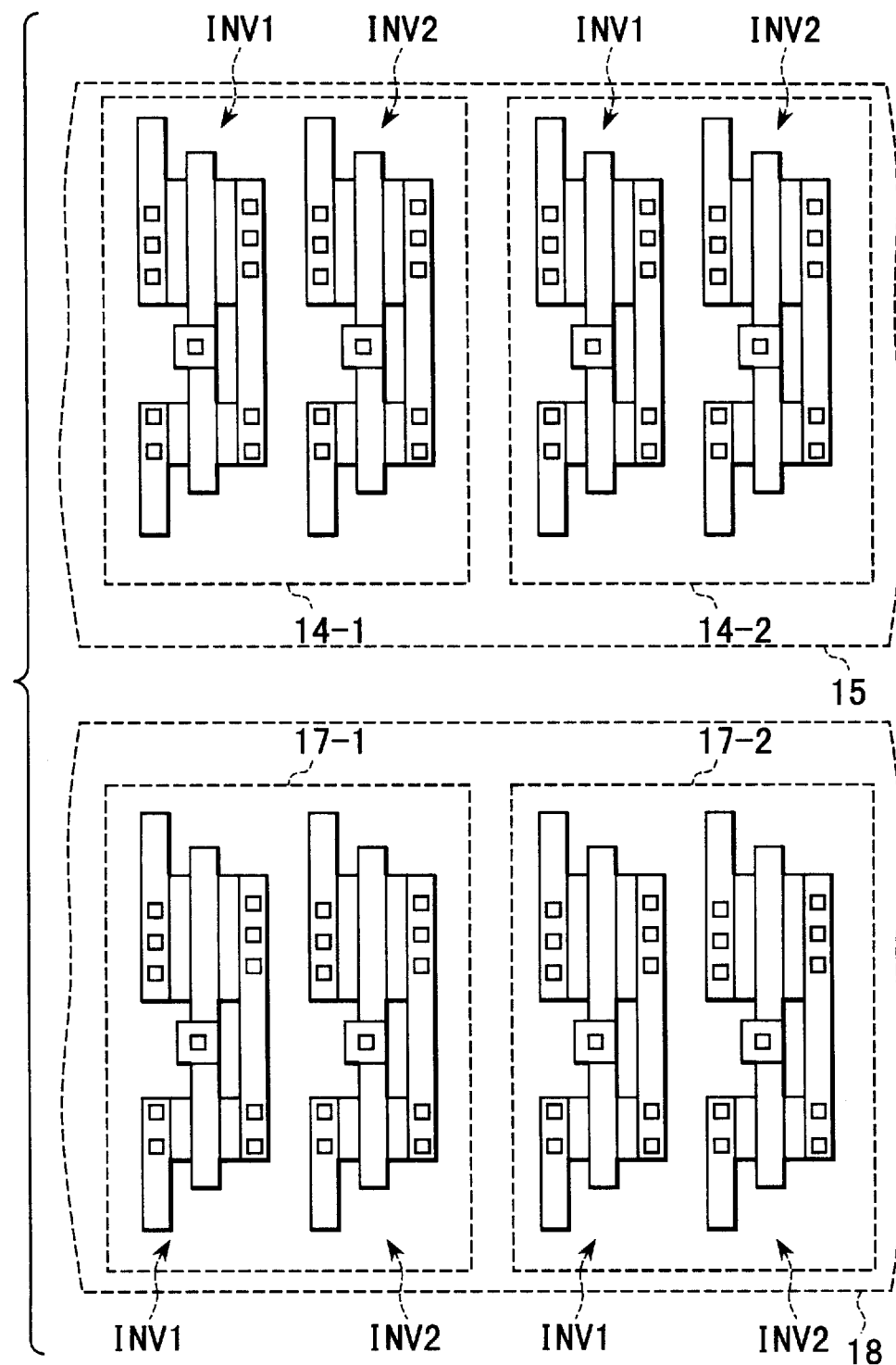
FIG. 18 is a diagram showing a layout of the delay units shown in FIG. 17.

FIG. 18 shows a layout of four delay units 14-1, 14-2, 17-1 and 17-2 shown in FIG. 17. In a case of FIG. 18, each of delay units 14-1, 14-2, 17-1 and 17-2 is constituted by, for example, two inverter circuits INV1 and INV2.

The pattern of the inverter circuits INV1 and INV2 in the delay unit 14-1 in the delay line 15 for forward pulse, is designed to be the same as the pattern of the inverter circuits INV1 and INV2 in the delay unit 14-2 that is adjacent to the delay unit 14-2, as shown in FIG. 18. In addition, the patterns of the inverter circuits INV1 and INV2 in the delay units for backward pulse 17-1 and 17-2 are designed to be the same as those in the delay units 14-1 and 14-2. The direction of the channel length of transistors constituting each of the inverter circuits is arranged along the direction of alignment of the delay units.

Figure 19:
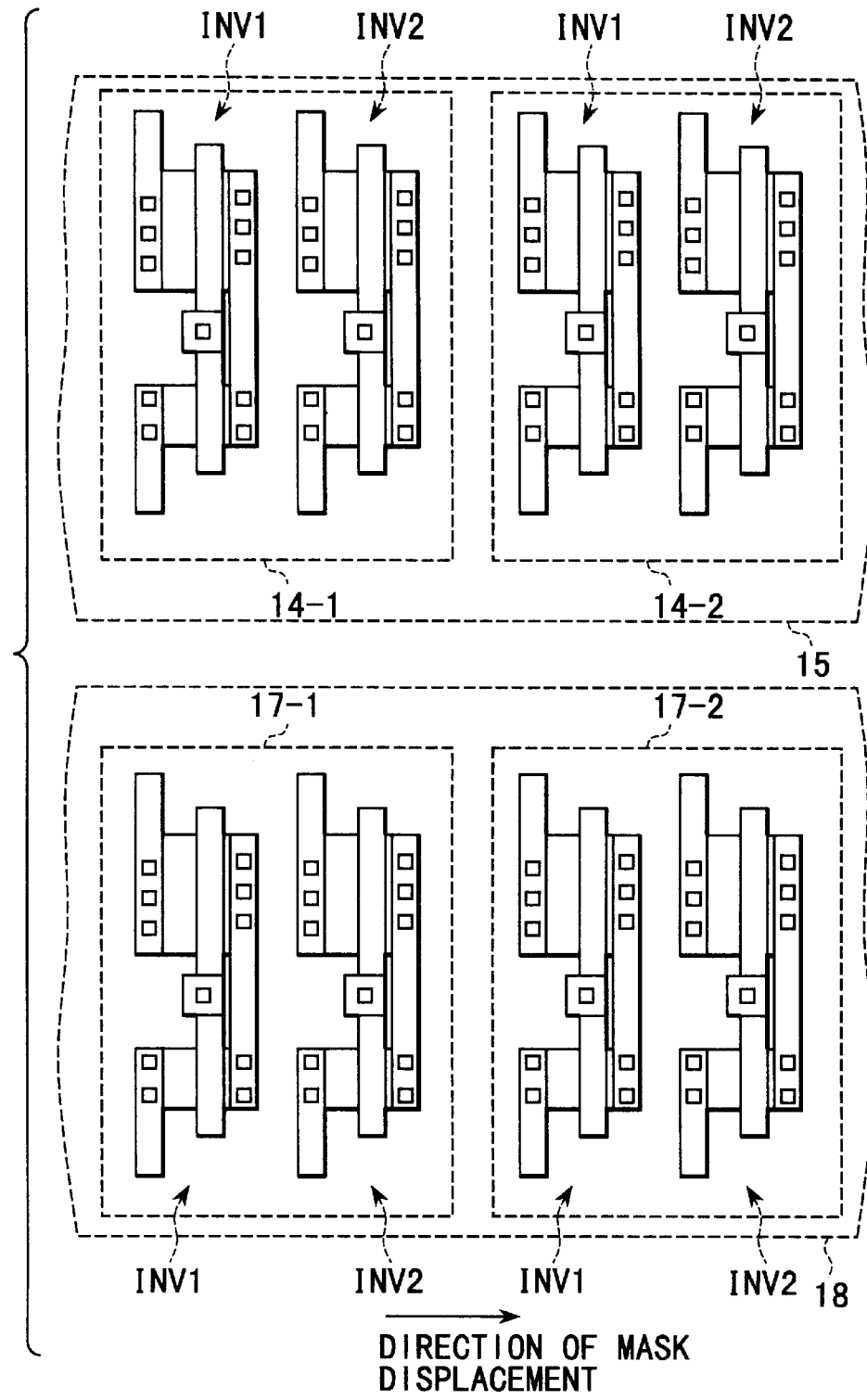
FIG. 19 is a diagram to explain the mask displacement of the delay units shown in FIG. 18.

FIG. 19 shows a case where a mask is displaced in a direction of an arrow or, for example, in the direction of the channel length of the MOS transistors (i.e. a direction from the source area to the drain area), in the layout shown in FIG. 18. In this case, the direction of displacement of the patterns of the delay units 14-1 and 14-2 for forward pulse is the same as the direction of displacement of the patterns of the delay units 17-1 and 17-2 for backward pulse.

Figure 20:
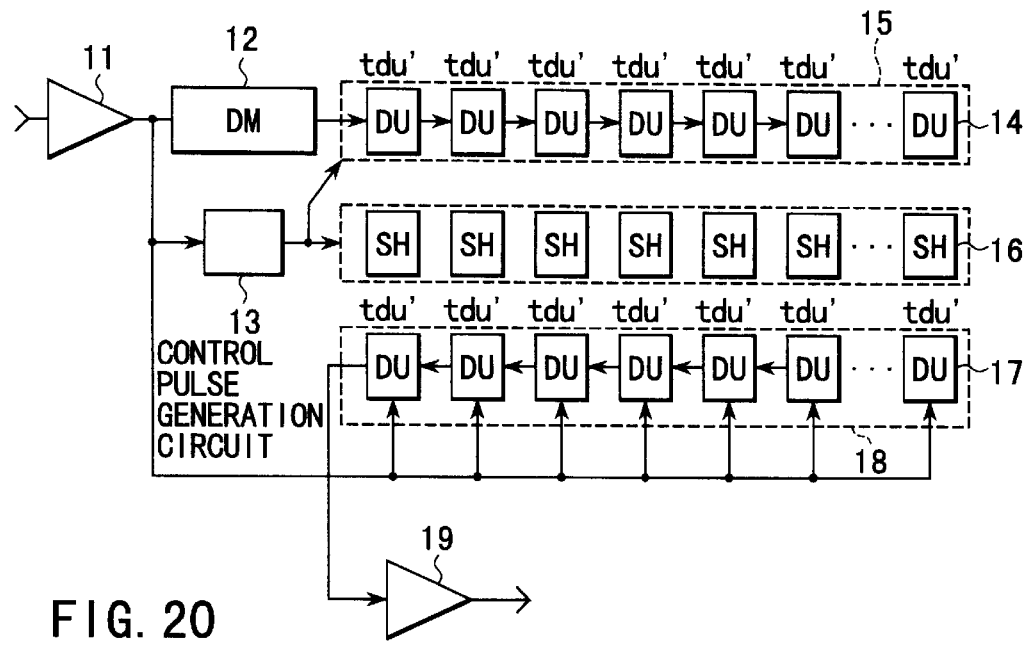
FIG. 20 is a block diagram showing a clock synchronization delay control circuit according to the fifth embodiment.

FIG. 20 shows a delay time of each delay line in a case where the mask is displaced when the delay units are arranged as shown in FIGS. 17 to 20. In the present embodiment, the delay time of each of the delay units in the delay line 15 for forward pulse and the delay line 18 for backward pulse becomes, for example, tdu'. However, the connection of the delay units 14-1 and 14-2 for forward pulse and the connection of the delay units 17-1 and 17-2 for backward pulse, are set as shown in FIG. 17. Therefore, the delay time in the delay line 15 for forward pulse becomes equal to the delay time in the delay line 18 for backward pulse.

According to the fifth embodiment, the directions of from the input terminal IN to the output terminal OUT, of the delay units 14-1 to 14-4 and 17-1 to 17-4 constituting the delay line 15 for forward pulse and the delay line 18 for backward pulse are made the same, and the directions from the input terminal IN to the output terminal OUT are made in parallel to the directions of alignment of the delay units 14-1 to 14-4 and 17-1 to 17-4. Further, the input terminals IN and the output terminals OUT, of the delay units 17-1 to 17-4 of the delay line 18 for backward pulse, are sequentially connected by the wiring L1 so that the direction of the delay units 17-1 to 17-4 corresponds to the direction of propagation of the backward pulse signal. For this reason, the error of the delay time is not summed up regardless of the number of the delay units to which the pulse signal is propagated.

Further, according to the present embodiment, the characteristics of the clock synchronization delay control circuit can be enhanced without improving the process.

Moreover, the distance between the input terminal IN and the output terminal OUT in the delay units 14-1 to 14-4 for forward pulse is different from that in the delay units 17-1 to 17-4 for backward pulse. However, the capacity of the wiring L1 connecting the delay units 14-1 to 14-4 is set to be equal to the capacity of the wiring L2 connecting the delay units 17-1 to 17-4. Therefore, the RC time constants of the wiring L1 and the wiring L2 can be made substantially equal, and the delay time in the wiring L1 can be made substantially equal to the delay time in the wiring L2.

Next, a sixth embodiment of the present invention will be explained with reference to FIG. 21. In the present embodiment, the same portions as those of the first embodiment are denoted by the same reference numerals, and only different portions are explained.

Figure 21:
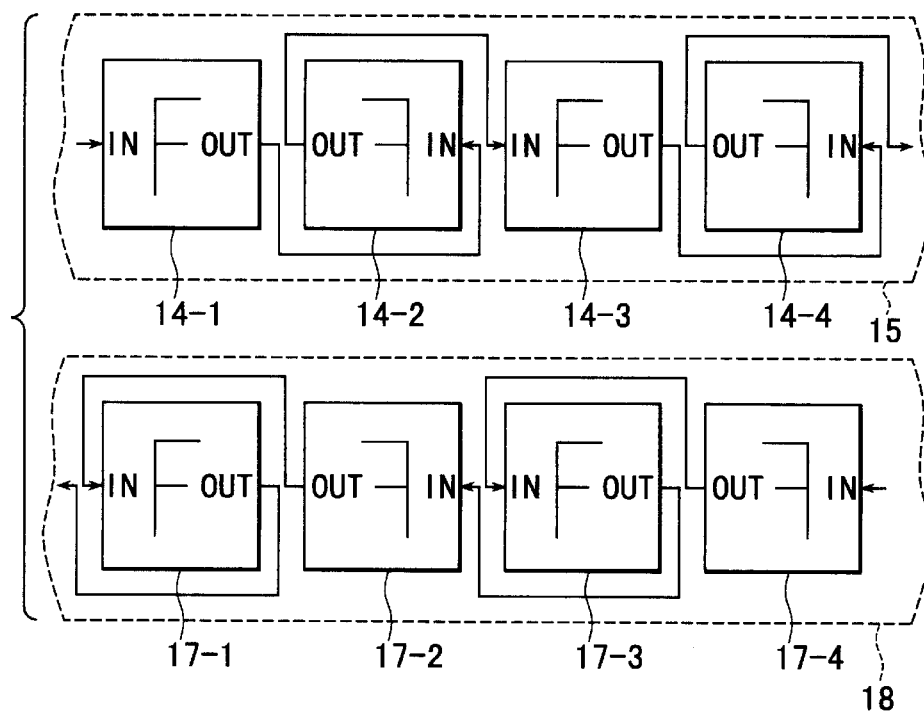
FIG. 21 is a block diagram showing an arrangement of delay units according to a sixth embodiment of the present invention.

In FIG. 21, the direction from the input terminal IN to the output terminal OUT in each of delay units 14-1 to 14-4 and 17-1 to 17-4 constituting the delay line 15 for forward pulse and the delay line 18 for backward pulse, is made in parallel to the direction of the delay lines 15 and 18. Further, the directions from the input terminal IN to the output terminal OUT in two adjacent delay units, of the delay units 14-1 to 14-4 constituting the delay line 15, are opposite to one another. The directions from the input terminal IN to the output terminal OUT in two adjacent delay units, of the delay units 17-1 to 17-4 constituting the delay line 18, are opposite to one another. Further, unlike the first embodiment shown in FIG. 1, the delay units 17-1 to 17-4 constituting the delay line 18 are aligned in the same direction as the delay units 14-1 to 14-4 constituting the delay line 15.

FIG. 22 shows a layout of four delay units 14-1, 14-2, 17-1 and 17-2 shown in FIG. 21. In a case of FIG. 22, each of delay units 14-1, 14-2, 17-1 and 17-2 is constituted by, for example, two inverter circuits INV1 and INV2. In the delay line 15 for forward pulse, the pattern of the inverter circuits INV1 and INV2 in the delay unit 14-1 is arranged symmetrically with that of the inverter circuits INV1 and INV2 in the delay unit 14-2, about the boundary line of the delay units 14-1 and 14-2, as shown in FIG. 22. In the delay line 18 for backward pulse, the pattern of the inverter circuits INV1 and INV2 in the delay unit 17-1 is arranged symmetrically with that of the inverter circuits INV1 and INV2 in the delay unit 17-2, about the boundary line of the delay units 17-1 and 17-2. The pattern of the inverter circuits INV1 and INV2 of the delay units for backward pulse 17-1 and 17-2 is the same as the pattern of the inverter circuits INV1 and INV2 of the delay units 14-1 and 14-2. The direction of the channel length of transistors constituting each of the inverter circuits is arranged along the direction of alignment of the delay units.

Figure 23:
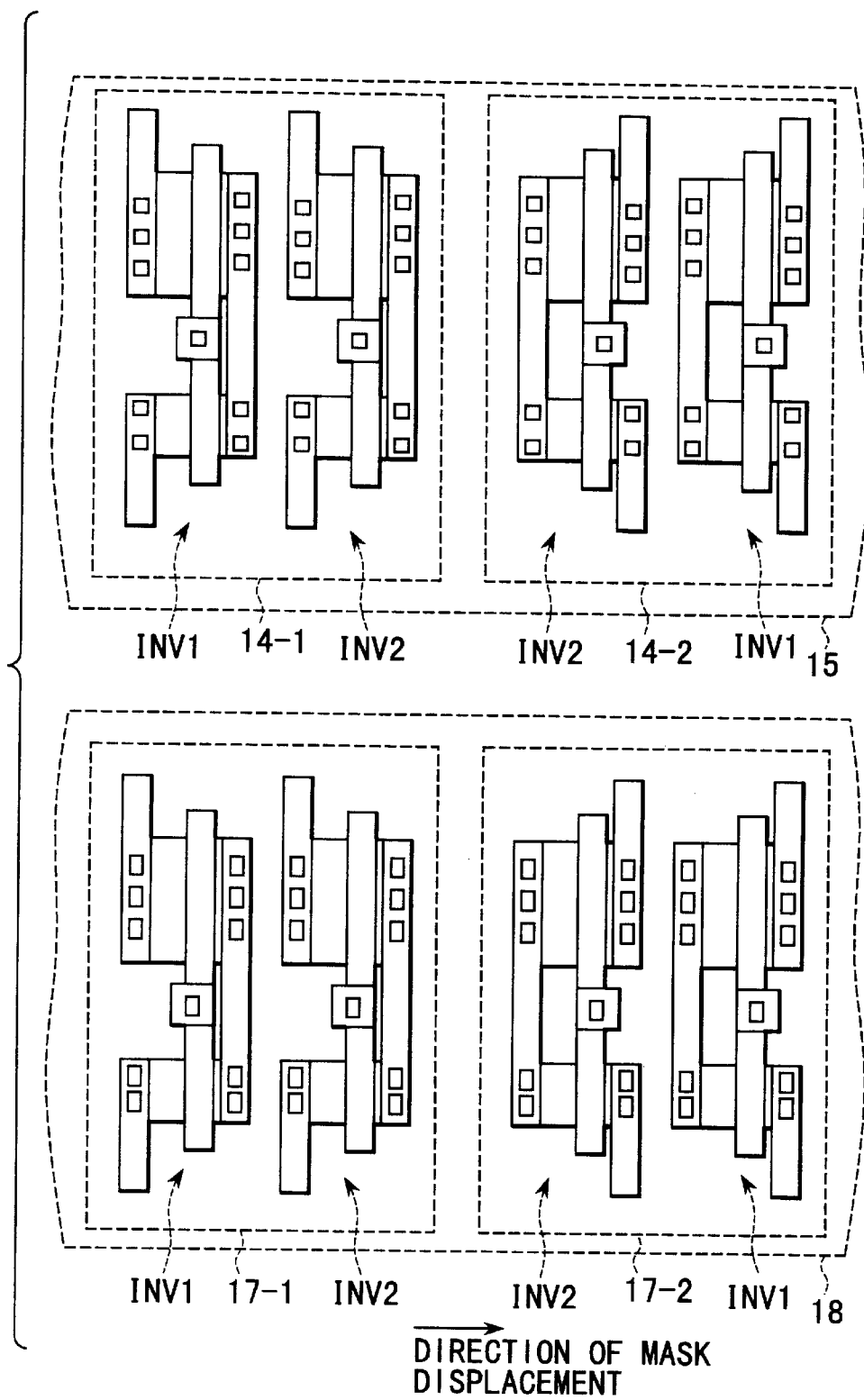
FIG. 23 is a diagram to explain the mask displacement of the delay units shown in FIG. 22.

FIG. 23 shows a case where a mask is displaced in a direction of an arrow or, for example, in the direction of the channel length of the MOS transistors (i.e. a direction from the source area to the drain area), in the layout shown in FIG. 22. In this case, the delay time of the delay unit 14-1 for forward pulse becomes equal to the delay time of the delay unit 17-2 for backward pulse, and the delay time of the delay unit 14-2 for forward pulse becomes equal to the delay time of the delay unit 17-1 for backward pulse.

Figure 24:
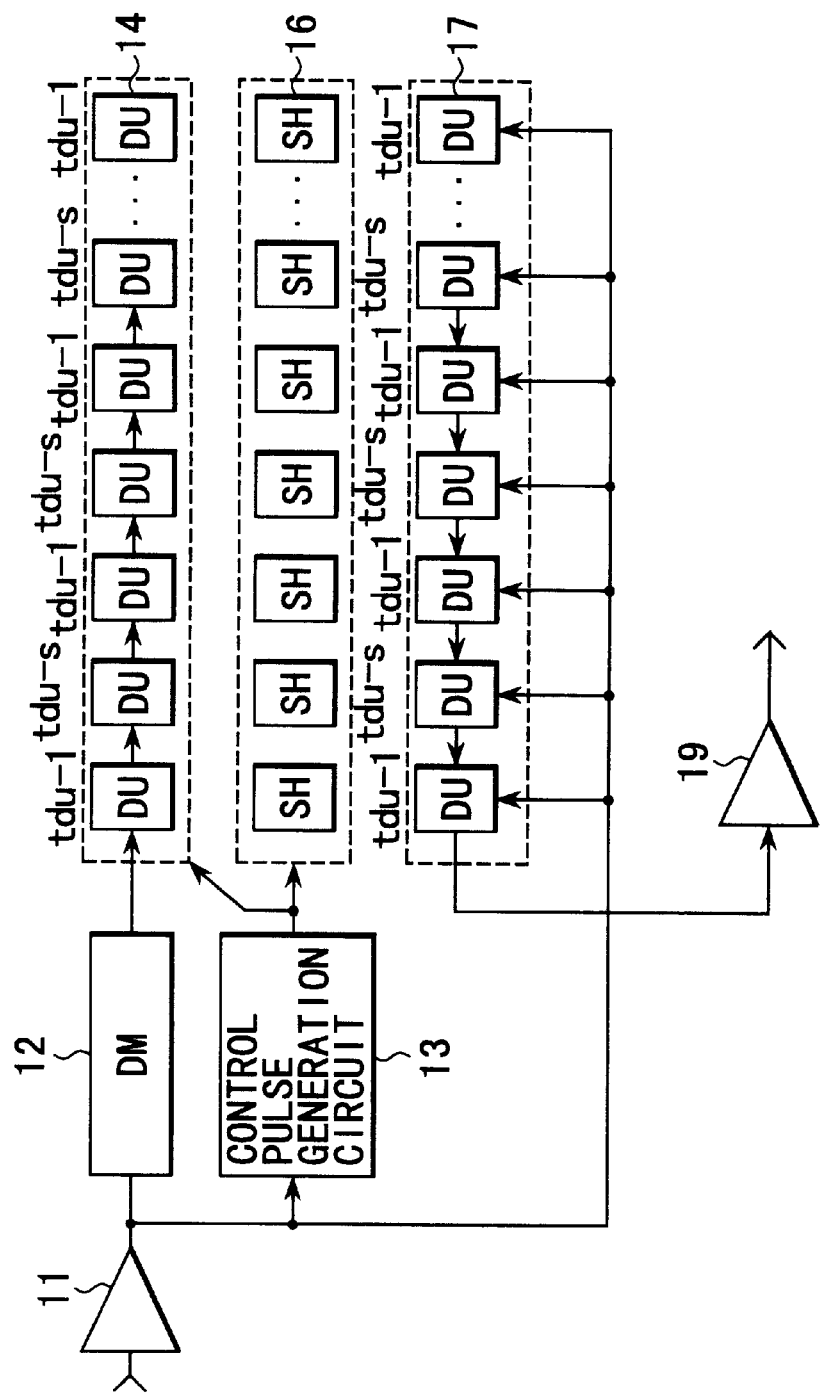
FIG. 24 is a block diagram showing a clock synchronization delay control circuit according to the sixth embodiment.

FIG. 24 shows a delay time of each delay line in a case where the mask is displaced when the delay units are arranged as shown in FIGS. 21 to 23. When the delay times of adjacent delay units in the delay line 15 for forward pulse are represented by tdu-1 and tdu-s, the delay times tdu-1 and tdu-s in the delay line 15 for forward pulse are alternately generated as shown in FIG. 24. The delay times tdu-s and tdu-1 are also generated alternately in the delay line 18 for backward pulse, similarly to the delay line 15 for forward pulse. In the present embodiment, the delay times of the delay units at the same stage are equal, in the delay line 15 for forward pulse and the delay line 18 for backward pulse. The present embodiment is different from the first embodiment shown in FIG. 4 with respect to this point.

In this structure, when it is assumed that a forward pulse signal is propagated up to the N-th stage of the delay line 15 for forward pulse during the time τ–(Trc+Tdr), total delay time Δf in the delay line 15 for forward pulse and total delay time Δb in the delay line 18 for backward pulse can be represented in the following equations.

(I) If N=2k (k is an integer equal to or larger than 1), $$\Delta f = tdu\text{-}1 \times k + tdu\text{-}s \times k$$

$$\Delta b = tdu\text{-}1 \times k + tdu\text{-}s \times k$$

A difference between the delay times Δf and Δb is expressed in the following equation (5-1).

$$\Delta f - \Delta b = 0 \quad (5\text{-}1)$$

Therefore, no delay time error occurs between the delay line 15 for forward pulse and the delay line 18 for backward pulse.

(II) If N=2k+1 (k is an integer equal to or larger than 0), $$\Delta f = tdu\text{-}1 \times k + tdu\text{-}s \times k + tdu\text{-}1$$

$$\Delta b = tdu\text{-}1 \times k + tdu\text{-}s \times k + tdu\text{-}1$$

A difference between the delay times Δf and Δb is expressed in the following equation (5-2).

$$\Delta f - \Delta b = 0 \quad (5\text{-}2)$$

Therefore, in this case, no delay time error occurs between the delay line 15 for forward pulse and the delay line 18 for backward pulse.

According to the sixth embodiment, the direction of from the input terminal IN to the output terminal OUT in each of the delay units 14-1 to 14-4 and 17-1 to 17-4 constituting the delay line 15 for forward pulse and the delay line 18 for backward pulse is made in parallel to the direction of the alignment of the delay lines 15 and 18. Further, the directions from the input terminal IN to the output terminal OUT in two adjacent delay units, of the delay units 14-1 to 14-4 constituting the delay line 15, is opposite to one another. The delay units 17-1 to 17-4 constituting the delay line 18 are aligned in the same direction as the delay units 14-1 to 14-4 constituting the delay line 15. For this reason, even if the circuit pattern of the delay unit is displaced, the error of the delay time does not occur regardless of the number of the delay units to which the pulse signal is propagated.

In addition, according to the present embodiment, the characteristics of the clock synchronization delay control circuit can be enhanced without improving the process. In addition, the adjacent delay units are symmetrical. For this reason, the adjacent delay units can be made the same with respect to the resistance value and the capacity of the wiring.

Figure 25:
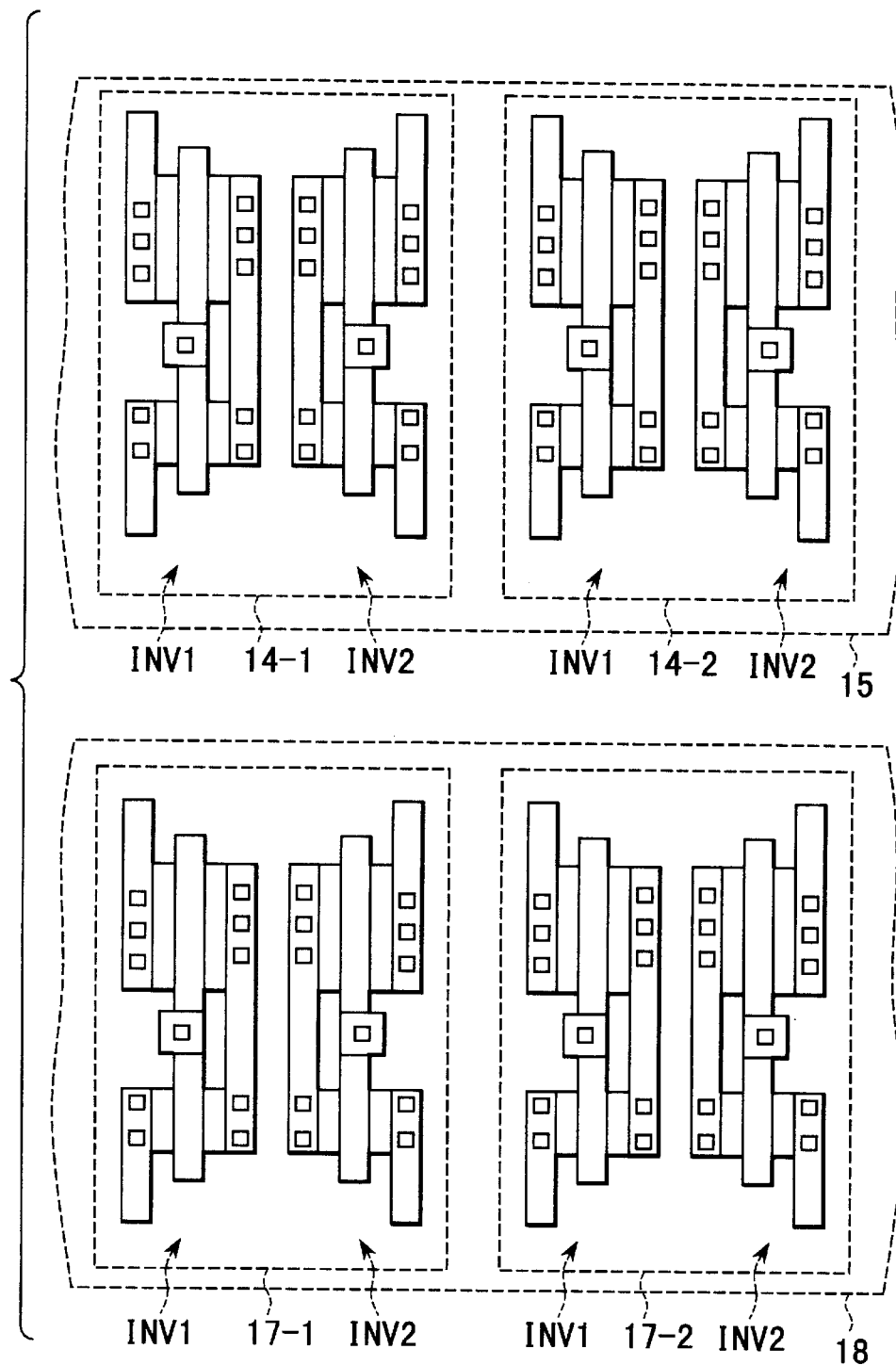
FIG. 25 is a diagram showing a layout of delay units according to a seventh embodiment of the present invention.

FIG. 25 shows a seventh embodiment of the present invention. In the present embodiment, the same portions as those of the first to sixth embodiments are denoted by the same reference numerals, and only different portions are explained.

In the first to sixth embodiments, the patterns of the inverter circuits INV1 and INV2 constituting each of the delay units are arranged in the same direction. On the other hand, in the seventh embodiment, the patterns of the inverter circuits INV1 and INV2 constituting the delay units are arranged symmetrically about the boundary of the inverter circuits INV1 and INV2 as shown in FIG. 25. Such an arrangement of the inverter circuits INV1 and INV2 can be applied to the first to sixth embodiments.

In the seventh embodiment, the same advantage as that of the first to sixth embodiments can be obtained. The inverter circuits can be replaced with other gate logics.

Figure 26:
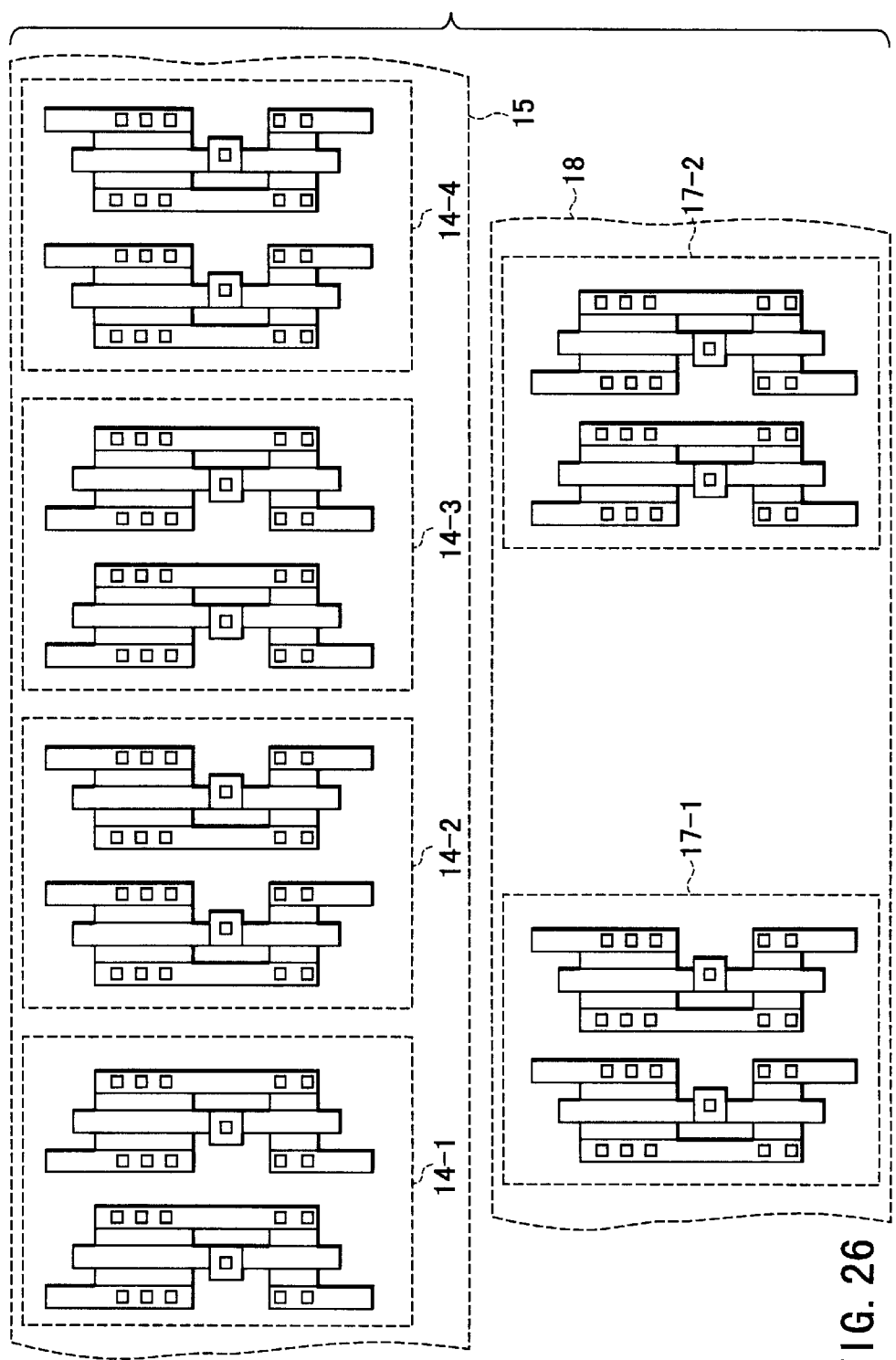
FIG. 26 is a diagram showing a layout of delay units according to an eighth embodiment of the present invention.

FIG. 26 shows an eighth embodiment of the present invention. In the present embodiment, the same portions as those of the first to sixth embodiments are denoted by the same reference numerals, and only different portions are explained.

In the first to sixth embodiments, the number of the delay units constituting the delay line 15 for forward pulse is equal to the number of the delay units constituting the delay line 18 for backward pulse. On the other hand, in the eighth embodiment, the number of delay units constituting the delay line 15 for forward pulse is set at KX+A (each of K and X is a positive integer, and A is an integer equal to or larger than 0 and also smaller than K), and the number of delay units constituting the delay line 18 for backward pulse is set at X. FIG. 26 shows a case when K=2. In such a structure, a clock synchronization delay control circuit for generating an internal clock which phase is shifted by half of wavelength to the external clock signal can be constituted.

FIG. 26 shows a case where the eighth embodiment is applied to the first embodiment. That is, the structure of the delay line 15 for forward pulse in FIG. 26 is the same as that of the first embodiment shown in FIGS. 1 and 2. On the other hand, for example, the delay units 17-3 and 17-4 are removed from the delay line 18 shown in FIGS. 1 and 2. That is, every two delay units are removed from the delay line 18. For this reason, the delay units 17-1 and 17-2 can compensate for the error in the delay time caused by the displacement of the mask. The input terminal IN and the output terminal OUT in each of the delay units 17-1 and 17-2 are sequentially connected by the wiring (not shown), along the direction of propagation of the backward pulse signal.

According to the eighth embodiment, the patterns of the delay units constituting the delay line 15 for forward pulse and the delay line 18 for backward pulse are alternately reversed. Therefore, the error in the delay time can be prevented even if the circuit pattern of the delay units is displaced, in the clock synchronization delay control circuit for generating the internal clock signal which phase is shifted by half of a wavelength to the external clock signal.

In the above-described first to eighth embodiments, the present invention is applied to the STBD. However, the present invention can also be applied to a clock synchronization delay control circuit shown in FIGS. 33 to 36B.

In each of the embodiments, too, the delay unit is constituted by two inverter circuits. However, the delay unit can also be constituted by, for example, at least one gate logic.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A clock synchronization delay control circuit comprising:
    a first delay line in which a pulse signal is propagated, said first delay line having a plurality of first delay units; and
    a second delay line in which a pulse signal is propagated in a direction opposite to the direction of propagation in said first delay line, said second delay line having a plurality of second delay units,
    wherein said first delay line has a first propagation time, said second delay line has a second propagation time, and an error between said first propagation time and said second propagation time is controlled by symmetrically arranging at least a part of circuit patterns on said plurality of first and second delay units.

2. A circuit according to claim 1, wherein each of said first and second delay units has at least one gate logic.

3. A clock synchronization delay control circuit comprising:
    a first delay line in which a pulse signal is propagated, said first delay line having a first delay unit and a second delay unit; and
    a second delay line in which a pulse signal is propagated in a direction opposite to the direction of propagation in said first delay line, said second delay line having a third delay unit and a fourth delay unit,
    wherein
        each of said first to fourth delay units has an input terminal and an output terminal;
        a direction from the input terminal to the output terminal in the first delay unit is set to be opposite to a direction from the input terminal to the output terminal in the second delay unit;
        a direction from the input terminal to the output terminal in the third delay unit is set to be opposite to a direction from the input terminal to the output terminal in the fourth delay unit;
        a direction from the input terminal to the output terminal in said first delay unit is set to be opposite to a direction from the input terminal to the output terminal in said third delay unit; and
        a direction from the input terminal to the output terminal in said second delay unit is set to be opposite to a direction from the input terminal to the output terminal in said fourth delay unit.

4. A circuit according to claim 3, wherein said first delay unit has at least one first gate logic, said second delay unit has at least one second gate logic, and said first and second gate logics are arranged symmetrically about a boundary between said first and second gate logics.

5. A circuit according to claim 3, wherein said third delay unit has at least one third gate logic, said fourth delay unit has at least one fourth gate logic, and said third and fourth gate logics are arranged symmetrically about a boundary between said third and fourth gate logics.

6. A circuit according to claim 3, wherein said first delay line has a number (KX+A) of first delay units and said second delay line has X number of delay units where each of K and X represents a positive integer and A represents an integer equal to or larger than 0 and also smaller than K.

7. A circuit according to claim 3, wherein the direction from said input terminal to said output terminal is a direction of a channel length of a transistor.

8. A circuit according to claim 3, wherein each of said first to fourth delay units has a fifth gate logic and a six gate logic, and said fifth and sixth gate logics are arranged symmetrically about the boundary between said fifth and sixth gate logics.

9. A clock synchronization delay control circuit comprising:
    a first delay line in which a pulse signal is propagated, said first delay line having a first delay unit and a second delay unit; and
    a second delay line in which a pulse signal is propagated in a direction opposite to the direction of propagation in said first delay line, said second delay line having a third delay unit and a fourth delay unit,
    wherein
        each of said first to fourth delay units has an input terminal and an output terminal;
        a direction from the input terminal to the output terminal in said first and second delay units is perpendicular to a direction of said first delay line;
        a direction from the input terminal to the output terminal in said third and fourth delay units is perpendicular to a direction of said second delay line;
        a direction from the input terminal to the output terminal in the first delay unit is set to be same to a direction from the input terminal to the output terminal in the second delay unit;
        a direction from the input terminal to the output terminal in the third delay unit is set to be same to a direction from input terminal to the output terminal in the forth delay unit;
        a direction from the input terminal to the output terminal in said first delay unit is set to be the same as a direction from the input terminal to the output terminal in said third delay unit; and
        a direction from the input terminal to the output terminal in said second delay unit is set to be the same as a direction from the input terminal to the output terminal in said fourth delay unit.

10. A circuit according to claim 9, wherein said first delay unit has at least one first gate logic, said second delay unit has at least one second gate logic, and said first and second gate logics are arranged symmetrically about a boundary between said first and second gate logics.

11. A circuit according to claim 9, wherein said third delay unit has at least one third gate logic, said fourth delay unit has at least one fourth gate logic, and said third and fourth gate logics are arranged symmetrically about a boundary between said third and fourth gate logics.

12. A circuit according to claim 9, wherein said first delay line has a number (KX+A) of first delay units and said second delay line has X number of delay units where each of K and X represents a positive integer and A represents an integer equal to or larger than 0 and also smaller than K.

13. A circuit according to claim 9, wherein the direction from said input terminal to said output terminal is a direction of a channel length of a transistor.

14. A circuit according to claim 9, wherein each of said first to fourth delay units has a fifth gate logic and a six gate logic, and said fifth and sixth gate logics are arranged symmetrically about the boundary between said fifth and sixth gate logics.

15. A clock synchronization delay control circuit comprising:
   a first delay line in which a pulse signal is propagated, said first delay line having a first delay unit and a second delay unit; and
   a second delay line in which a pulse signal is propagated in a direction opposite to the direction of propagation in said first delay line, said second delay line having a third delay unit and a fourth delay unit,
   wherein
      each of said first to fourth delay units has an input terminal and an output terminal;
      a direction from the input terminal to the output terminal in said first and second delay units is perpendicular to a direction of said first delay line;
      a direction from the input terminal to the output terminal in said third and fourth delay units is perpendicular to a direction of said second delay line at right angles;
      a direction from the input terminal to the output terminal in said first delay unit is set to be opposite to a direction from the input terminal to the output terminal in said second delay unit;
      a direction from the input terminal to the output terminal in said third delay unit is set to be opposite to the direction from the input terminal to the output terminal in said fourth delay unit;
      a direction from the input terminal to the output terminal in said first delay unit is set to be the same as a direction from the input terminal to the output terminal in said third delay unit; and
      a direction from the input terminal to the output terminal in said second delay unit is set to be the same as the direction from the input terminal to the output terminal in said fourth delay unit.

16. A circuit according to claim 15, wherein said first delay unit has at least one first gate logic, said second delay unit has at least one second gate logic, and said first and second gate logics are arranged symmetrically about a boundary between said first and second gate logics.

17. A circuit according to claim 15, wherein said third delay unit has at least one third gate logic, said fourth delay unit has at least one fourth gate logic, and said third and fourth gate logics are arranged symmetrically about a boundary between said third and fourth gate logics.

18. A circuit according to claim 15, wherein said first delay line has a number (KX+A) of first delay units and said second delay line has X number of delay units where each of K and X represents a positive integer and A represents an integer equal to or larger than 0 and also smaller than K.

19. A circuit according to claim 15, wherein the direction from said input terminal to said output terminal is a direction of a channel length of a transistor.

20. A circuit according to claim 15, wherein each of said first to fourth delay units has a fifth gate logic and a six gate logic, and said fifth and sixth gate logics are arranged symmetrically about the boundary between said fifth and sixth gate logics.

21. A clock synchronization delay control circuit comprising:
   a first delay line in which a pulse signal is propagated, said first delay line having a first delay unit and a second delay unit; and
   a second delay line in which a pulse signal is propagated in a direction opposite to the direction of propagation in said first delay line, said second delay line having a third delay unit and a fourth delay unit,
   wherein
      each of said first to fourth delay units has an input terminal and an output terminal;
      a direction from the input terminal to the output terminal in said first and second delay units is set to be parallel to a direction of said first delay line;
      a direction from the input terminal to the output terminal in said third and fourth delay units is set to be parallel to a direction of said second delay line;
      a direction from the input terminal to the output terminal in said first delay unit is set to be opposite to a direction from the input terminal to the output terminal in said second delay unit;
      a direction from the input terminal to the output terminal in said third delay unit is set to be opposite to the direction from the input terminal to the output terminal in said fourth delay unit;
      a direction from the input terminal to the output terminal in said first delay unit is set to be opposite to a direction from the input terminal to the output terminal in said third delay unit;
      a direction from the input terminal to the output terminal in said second delay unit is set to be opposite to the direction from the input terminal to the output terminal in said fourth delay unit; and
      a pattern of said first delay unit is arranged symmetrically with respect to a point, with a pattern of said second delay unit, and a pattern of said third delay unit is arranged symmetrically with respect to a point, with a pattern of said fourth delay unit.

22. A circuit according to claim 21, wherein said first delay unit has at least one first gate logic, said second delay unit has at least one second gate logic, and said first and second gate logics are arranged symmetrically about a boundary between said first and second gate logics.

23. A circuit according to claim 21, wherein said third delay unit has at least one third gate logic, said fourth delay unit has at least one fourth gate logic, and said third and fourth gate logics are arranged symmetrically about a boundary between said third and fourth gate logics.

24. A circuit according to claim 21, wherein said first delay line has a number (KX+A) of first delay units and said second delay line has x number of delay units where each of K and X represents a positive integer and A represents an integer equal to or larger than 0 and also smaller than K.

25. A circuit according to claim 21, wherein the direction from said input terminal to said output terminal is a direction of a channel length of a transistor.

26. A circuit according to claim 21, wherein each of said first to fourth delay units has a fifth gate logic and a six gate logic, and said fifth and sixth gate logics are arranged symmetrically about the boundary between said fifth and sixth gate logics.

27. A clock synchronization delay control circuit comprising:
a first delay line in which a pulse signal is propagated, said first delay line having a first delay unit and a second delay unit; and
a second delay line in which a pulse signal is propagated in a direction opposite to the direction of propagation in said first delay line, said second delay line having a third delay unit and a fourth delay unit,
wherein
each of said first to fourth delay units has an input terminal and an output terminal;
a direction from the input terminal to the output terminal in said first and second delay units is set to be parallel to a direction of said first delay line;
a direction from the input terminal to the output terminal in said third and fourth delay units is set to be parallel to a direction of said second delay line;
a direction from the input terminal to the output terminal in said first delay unit is set to be the same as a direction from the input terminal to the output terminal in said second delay unit;
a direction from the input terminal to the output terminal in said third delay unit is set to be the same as the direction from the input terminal to the output terminal in said fourth delay unit;
a direction from the input terminal to the output terminal in said first delay unit is set to be the same as a direction from the input terminal to the output terminal in said third delay unit; and
a direction from the input terminal to the output terminal in said second delay unit is set to be the same as the direction from the input terminal to the output terminal in said fourth delay unit.

28. A circuit according to claim 27, wherein said first delay unit has at least one first gate logic, said second delay unit has at least one second logic, and said first and second gate logics are arranged in a same direction.

29. A circuit according to claim 27, wherein said third delay unit has at least one third gate logic, said fourth delay unit has at least one fourth gate logic, and said third and fourth gate logics are arranged in a same direction.

30. A circuit according to claim 27, further comprising:
a first wiring for connecting the output terminal of said first delay unit and the input terminal of said second delay unit; and
a second wiring for connecting the output terminal of said third delay unit and the input terminal of said fourth delay unit,
wherein a capacity of said first wiring is set to be equal to a capacity of said second wiring.

31. A circuit according to claim 27, wherein said first delay line has a number (KX+A) of first delay units and said second delay line has X number of delay units where each of K and X represents a positive integer and A represents an integer equal to or larger than 0 and also smaller than K.

32. A circuit according to claim 27, wherein the direction from said input terminal to said output terminal is a direction of a channel length of a transistor.

33. A circuit according to claim 27, wherein each of said first to fourth delay units has a fifth gate logic and a six gate logic, and said fifth and sixth gate logics are arranged symmetrically about the boundary between said fifth and sixth gate logics.

34. A clock synchronization delay control circuit comprising:
a first delay line in which a pulse signal is propagated, said first delay line having a first delay unit and a second delay unit; and
a second delay line in which a pulse signal is propagated in a direction opposite to the direction of propagation in said first delay line, said second delay line having a third delay unit and a fourth delay unit,
wherein
each of said first to fourth delay units has an input terminal and an output terminal;
a direction from the input terminal to the output terminal in said first and second delay units is set to be parallel to a direction of said first delay line;
a direction from the input terminal to the output terminal in said third and fourth delay units is set to be parallel to a direction of said second delay line;
a direction from the input terminal to the output terminal in said first delay unit is set to be opposite to a direction from the input terminal to the output terminal in said second delay unit;
a direction from the input terminal to the output terminal in said third delay unit is set to be opposite to the direction from the input terminal to the output terminal in said fourth delay unit;
a direction from the input terminal to the output terminal in said first delay unit is set to be the same as a direction from the input terminal to the output terminal in said third delay unit; and
a direction from the input terminal to the output terminal in said second delay unit is set to be the same as the direction from the input terminal to the output terminal in said fourth delay unit.

35. A circuit according to claim 34, wherein said first delay unit has at least one first gate logic, said second delay unit has at least one second gate logic, and said first and second gate logics are arranged symmetrically about a boundary between said first and second gate logics.

36. A circuit according to claim 34, wherein said third delay unit has at least one third gate logic, said fourth delay unit has at least one fourth gate logic, and said third and fourth gate logics are arranged symmetrically about a boundary between said third and fourth gate logics.

37. A circuit according to claim 34, wherein each of said first to fourth delay units has a fifth gate logic and a six gate logic, and said fifth and sixth gate logics are arranged symmetrically about the boundary between said fifth and sixth gate logics.

38. A circuit according to claim 34, wherein said first delay line has a number (KX+A) of first delay units and said second delay line has X number of delay units where each of K and X represents a positive integer and A represents an integer equal to or larger than 0 and also smaller than K.

39. A circuit according to claim 34, wherein the direction from said input terminal to said output terminal is a direction of a channel length of a transistor.

40. A clock synchronization delay control circuit comprising:

a first delay line in which a pulse signal is propagated, said first delay line having a first delay unit and a second delay unit; and a second delay line in which a pulse signal is propagated in a direction opposite to the direction of propagation in said first delay line, said second delay line having a third delay unit and a fourth delay unit, wherein
- a direction of a channel length of a transistor included in said first and second delay unit is set in parallel to a direction of said first delay line;
- a direction of a channel length of a transistor included in said third and fourth delay unit is set in parallel to a direction of said second delay line;
- a propagation direction of a pulse signal in a transistor included in said first delay unit is set in a direction opposite to a propagation direction of a pulse signal in a transistor included in said second delay unit;
- a propagation direction of a pulse signal in a transistor included in said third delay unit is set in a direction opposite to a propagation direction of a pulse signal in a transistor included in said fourth delay unit;
- a propagation direction of a pulse signal in a transistor included in said first delay unit is set in a direction opposite to a propagation direction of a pulse signal in a transistor included in said third delay unit; and
- a propagation direction of a pulse signal in a transistor included in said second delay unit is set in a direction opposite to a propagation direction of a pulse signal in a transistor included in said fourth delay unit.

41. A clock synchronization delay control circuit comprising:

a first delay line in which a pulse signal is propagated, said first delay line having a first delay unit and a second delay unit; and a second delay line in which a pulse signal is propagated in a direction opposite to the direction of propagation in said first delay line, said second delay line having a third delay unit and a fourth delay unit, wherein
- a propagation direction of a pulse signal of a transistor included in said first delay unit is set in a direction opposite to a propagation direction of a pulse signal in a transistor included in said second delay unit;
- a propagation direction of a pulse signal in a transistor included in said third delay unit is set in a direction opposite to a propagation direction of a pulse signal in a transistor included in said fourth delay unit;
- a propagation direction of a pulse signal in a transistor included in said first delay unit is set in a direction opposite to a propagation direction of a pulse signal in a transistor included in said third delay unit; and
- a propagation direction of a pulse signal in a transistor included in said second delay unit is set in a direction opposite to a propagation direction of a pulse signal in a transistor included in said fourth delay unit.

42. A clock synchronization delay control circuit comprising:

a first delay line in which a pulse signal is propagated, said first delay line having a first delay unit and a second delay unit; and a second delay line in which a pulse signal is propagated in a direction opposite to the direction of propagation in said first delay line, said second delay line having a third delay unit and a fourth delay unit, wherein
- a direction of a channel length of a transistor included in said first and second delay units is set in a direction perpendicular to a direction of said first delay line;
- a direction of a channel length of a transistor included in said third and fourth delay units is set in a direction perpendicular to a direction of said second delay line;
- a propagation direction of a pulse signal in a transistor included in said first delay unit is set in a direction the same as a propagation direction of a pulse signal in a transistor of said second delay unit;
- a propagation direction of a pulse signal in a transistor included in said third delay unit is set in a direction the same as a propagation direction of a pulse signal in a transistor of said fourth delay unit;
- a propagation direction of a pulse signal in a transistor included in said first delay unit is set in a direction the same as a propagation direction of a pulse signal in a transistor of said third delay unit; and
- a propagation direction of a pulse signal in a transistor included in said second delay unit is set in a direction the same as a propagation direction of a pulse signal in a transistor of said fourth delay unit.

43. A clock synchronization delay control circuit comprising:

a first delay line in which a pulse signal is propagated, said first delay line having a first delay unit and a second delay unit; and a second delay line in which a pulse signal is propagated in a direction opposite to the direction of propagation in said first delay line, said second delay line having a third delay unit and a fourth delay unit, wherein
- a direction of a channel length of a transistor included in said first and second delay units is set in a direction perpendicular to a direction of said first delay line;
- a direction of a channel length of a transistor included in said third and fourth delay units is set in a direction perpendicular to a direction of said second delay line;
- a propagation direction of a pulse signal in a transistor included in said first delay unit is set in a direction opposite to a propagation direction of a pulse signal in a transistor of said second delay unit;
- a propagation direction of a pulse signal in a transistor included in said third delay unit is set in a direction opposite to a propagation direction of a pulse signal in a transistor of said fourth delay unit;
- a propagation direction of a pulse signal in a transistor included in said first delay unit is set in a direction opposite to a propagation direction of a pulse signal in a transistor of said third delay unit; and
- a propagation direction of a pulse signal in a transistor included in said second delay unit is set in a direction opposite to a propagation direction of a pulse signal in a transistor of said fourth delay unit.

44. A clock synchronization delay control circuit comprising:

a first delay line in which a pulse signal is propagated, said first delay line having a first delay unit and a second delay unit; and a second delay line in which a pulse signal is propagated in a direction opposite to the direction of propagation in said first delay line, said second delay line having a third delay unit and a fourth delay unit, wherein
- a direction of a channel length of a transistor included in said first and second delay unit is set in parallel to a direction of said first delay line;
- a direction of a channel length of a transistor included in said third and fourth delay unit is set in parallel to a direction of said second delay line;
- a propagation direction of a pulse signal in a transistor included in said first delay unit is set in a direction opposite to a propagation direction of a pulse signal in a transistor included in said second delay unit;
- a propagation direction of a pulse signal in a transistor included in said third delay unit is set in a direction opposite to a propagation direction of a pulse signal in a transistor included in said fourth delay unit;
- a propagation direction of a pulse signal in a transistor included in said first delay unit is set in a direction opposite to a propagation direction of a pulse signal in a transistor included in said third delay unit;
- a propagation direction of a pulse signal in a transistor included in said second delay unit is set in a direction opposite to a propagation direction of a pulse signal in a transistor included in said fourth delay unit; and
- a pattern of said first delay unit is arranged symmetrically with respect to a point, with a pattern of said second delay unit, and a pattern of said third delay unit is arranged symmetrically with respect to a point, with a pattern of said fourth delay unit.

45. A clock synchronization delay control circuit comprising:
- a first delay line in which a pulse signal is propagated, said first delay line having a first delay unit and a second delay unit; and
- a second delay line in which a pulse signal is propagated in a direction opposite to the direction of propagation in said first delay line, said second delay line having a third delay unit and a fourth delay unit, wherein
- a direction of a channel length of a transistor included in said first and second delay unit is set in parallel to a direction of said first delay line;
- a direction of a channel length of a transistor included in said third and fourth delay unit is set in parallel to a direction of said second delay line;
- a propagation direction of a pulse signal in a transistor included in said first delay unit is set in a direction the same as a propagation direction of a pulse signal in a transistor included in said second delay unit;
- a propagation direction of a pulse signal in a transistor included in said third delay unit is set in a direction the same as a propagation direction of a pulse signal in a transistor included in said fourth delay unit;
- a propagation direction of a pulse signal in a transistor included in said first delay unit is set in a direction the same as a propagation direction of a pulse signal in a transistor included in said third delay unit; and
- a propagation direction of a pulse signal in a transistor included in said second delay unit is set in a direction the same as a propagation direction of a pulse signal in a transistor included in said fourth delay unit.

46. A clock synchronization delay control circuit comprising:
- a first delay line in which a pulse signal is propagated, said first delay line having a first delay unit and a second delay unit; and
- a second delay line in which a pulse signal is propagated in a direction opposite to the direction of propagation in said first delay line, said second delay line having a third delay unit and a fourth delay unit, wherein
- a direction of a channel length of a transistor included in said first and second delay units is set in parallel to a direction of said first delay line;
- a direction of a channel length of a transistor included in said third and fourth delay units is set in parallel to a direction of said second delay line;
- a propagation direction of a pulse signal in a transistor included in said first delay unit is set in a direction opposite to a propagation direction of a pulse signal in a transistor included in said second delay unit;
- a propagation direction of a pulse signal in a transistor included in said third delay unit is set in a direction opposite to a propagation direction of a pulse signal in a transistor included in said fourth delay unit;
- a propagation direction of a pulse signal in a transistor included in said first delay unit is set in a direction the same as a propagation direction of a pulse signal in a transistor included in said third delay unit; and
- a propagation direction of a pulse signal in a transistor included in said second delay unit is set in a direction the same as a propagation direction of a pulse signal in a transistor included in said fourth delay unit.

* * * * *